United States Patent
Godinez et al.

(10) Patent No.: US 12,003,158 B2
(45) Date of Patent: Jun. 4, 2024

(54) FORCE-PRODUCING ELECTROMAGNETIC MACHINE

(71) Applicant: HYPERLOOP TECHNOLOGIES, INC., Los Angeles, CA (US)

(72) Inventors: Noel Godinez, Los Angeles, CA (US); Tim Lambert, Los Angeles, CA (US); Irfan-ur-rab Usman, Los Angeles, CA (US); Erik Johnson, Los Angeles, CA (US)

(73) Assignee: HYPERLOOP TECHNOLOGIES, INC., Los Angeles, CA (US)

( * ) Notice: Subject to any disclaimer, the term of this patent is extended or adjusted under 35 U.S.C. 154(b) by 288 days.

(21) Appl. No.: 17/773,888

(22) PCT Filed: Nov. 5, 2020

(86) PCT No.: PCT/US2020/059012
§ 371 (c)(1),
(2) Date: May 3, 2022

(87) PCT Pub. No.: WO2021/092106
PCT Pub. Date: May 14, 2021

(65) Prior Publication Data
US 2022/0376595 A1    Nov. 24, 2022

Related U.S. Application Data

(60) Provisional application No. 62/931,987, filed on Nov. 7, 2019, provisional application No. 62/931,935, filed
(Continued)

(51) Int. Cl.
*H02K 41/03*    (2006.01)
*H01F 7/06*    (2006.01)
(Continued)

(52) U.S. Cl.
CPC ............. *H02K 41/03* (2013.01); *H01F 7/064* (2013.01); *H01F 7/081* (2013.01); *H01F 27/28* (2013.01);
(Continued)

(58) Field of Classification Search
CPC ........ B60L 13/03; B60L 15/2009; B60L 7/28; H02K 1/20; H02K 11/40; H02K 2201/15;
(Continued)

(56) References Cited

U.S. PATENT DOCUMENTS 4,544,856 A    10/1985  King
4,689,529 A    8/1987   Higuichi
(Continued)

FOREIGN PATENT DOCUMENTS

DE    19732564 A1      2/1999
DE    102006027819 A1  12/2007
(Continued)

OTHER PUBLICATIONS

"International Search Report" mailed Mar. 1, 2021, issued in corresponding PCT Application No. PCT/US2020/059010, Filed Nov. 5, 2020.
(Continued)

*Primary Examiner* — Naishadh N Desai
(74) *Attorney, Agent, or Firm* — Seyfarth Shaw LLP

(57) ABSTRACT

An electromagnetic machine for generating force is provided. The electromagnetic machine includes a magnet having opposing sides extending along a longitudinal axis. The electromagnetic machine includes a pair of ferromagnetic bodies respectively extending along the opposing sides of the magnet, and along the longitudinal axis, each of the ferromagnetic bodies comprising: a back-iron portion; and a pole portion extending from the back-iron portion. The magnet and the ferromagnetic bodies include reciprocal
(Continued)

retention devices at the opposing sides along the longitudinal axis. The electromagnetic machine includes electrical windings around respective pole portions of the ferromagnetic bodies, the electrical windings around the respective pole portions being independently controllable. The electromagnetic machine includes at least one cold plate configured to thermally isolate the magnet from the electrical windings.

19 Claims, 14 Drawing Sheets

Related U.S. Application Data on Nov. 7, 2019, provisional application No. 62/932,013, filed on Nov. 7, 2019, provisional application No. 62/932,077, filed on Nov. 7, 2019, provisional application No. 62/932,113, filed on Nov. 7, 2019, provisional application No. 62/945,978, filed on Dec. 10, 2019.

(51) Int. Cl.

| | | |
|---|---|---|
| *H01F 7/08* | (2006.01) | |
| *H01F 27/28* | (2006.01) | |
| *H02K 1/14* | (2006.01) | |
| *H02K 1/18* | (2006.01) | |
| *H02K 1/20* | (2006.01) | |
| *H02K 3/04* | (2006.01) | |
| *H02K 5/22* | (2006.01) | |
| *H02K 9/22* | (2006.01) | |
| *H02K 11/21* | (2016.01) | |
| *H02K 11/25* | (2016.01) | |
| *H02K 41/025* | (2006.01) | |
| *H02K 49/04* | (2006.01) | |
| *H05K 7/20* | (2006.01) | |
| *H01F 7/11* | (2006.01) | |
| *H02K 7/10* | (2006.01) | |

(52) U.S. Cl.
CPC ............... *H02K 1/14* (2013.01); *H02K 1/143* (2013.01); *H02K 1/18* (2013.01); *H02K 1/20* (2013.01); *H02K 3/04* (2013.01); *H02K 5/225* (2013.01); *H02K 9/227* (2021.01); *H02K 11/21* (2016.01); *H02K 11/25* (2016.01); *H02K 41/025* (2013.01); *H02K 41/031* (2013.01); *H02K 49/046* (2013.01); *H05K 7/20254* (2013.01); *H01F 2007/086* (2013.01); *H01F 7/11* (2013.01); *H02K 7/10* (2013.01); *H02K 2201/15* (2013.01); *H02K 2213/12* (2013.01)

(58) Field of Classification Search
CPC ........ H02K 2213/12; H02K 3/18; H02K 3/40; H02K 3/52; H02K 41/03; H02K 5/225; H02K 7/10; H02K 1/14; H02K 1/141; H02K 1/143; H02K 1/148; H02K 1/18; H02K 1/185; H02K 11/21; H02K 11/25; H02K 15/022; H02K 2201/12; H02K 3/04; H02K 41/025; H02K 41/031; H02K 49/046; H02K 7/104; H02K 9/227; H05K 7/20254; Y02T 10/64; Y02T 10/72; H01F 2007/086; H01F 27/28; H01F 7/064; H01F 7/081; H01F 7/11; H01M 4/26; H01M 4/621
See application file for complete search history.

(56) References Cited

U.S. PATENT DOCUMENTS

| | | | |
|---|---|---|---|
| 4,788,477 A * | 11/1988 | Teramachi | H02K 41/033 318/135 |
| 5,289,088 A | 2/1994 | Andoh | |
| 5,868,077 A | 2/1999 | Kuznetsov | |
| 6,522,035 B1 | 2/2003 | Smit | |
| 2002/0053835 A1* | 5/2002 | Joong | H02K 41/031 310/12.21 |
| 2002/0081528 A1 | 6/2002 | Miyajima et al. | |
| 2005/0029874 A1 | 2/2005 | Dadd | |
| 2006/0131967 A1 | 6/2006 | Lin et al. | |
| 2012/0249991 A1 | 10/2012 | Hol et al. | |
| 2013/0015725 A1* | 1/2013 | Trammell | H02K 41/031 310/12.26 |
| 2013/0113320 A1* | 5/2013 | Calley | H02K 1/145 310/216.061 |
| 2015/0091393 A1* | 4/2015 | Hayner | H02K 9/227 310/12.29 |
| 2015/0171706 A1 | 6/2015 | Dadd | |
| 2018/0131258 A1 | 5/2018 | Dawidowicz | |

FOREIGN PATENT DOCUMENTS

| | | |
|---|---|---|
| EP | 0093547 A1 | 11/1983 |
| EP | 1213819 A2 | 6/2002 |
| EP | 1511164 A2 | 3/2005 |
| EP | 1544980 A1 | 6/2005 |
| EP | 2876783 A1 | 5/2015 |
| EP | 3107195 A1 | 12/2016 |
| EP | 3258131 A1 | 12/2017 |
| FR | 1165541 A1 | 10/1958 |
| FR | 2526570 A1 | 11/1983 |
| JP | S586055 A | 1/1983 |
| JP | S5886859 A | 5/1983 |
| JP | S6098864 A | 6/1985 |
| WO | 03105317 A1 | 12/2003 |
| WO | 2008142001 A2 | 11/2008 |

OTHER PUBLICATIONS

"International Search Report" mailed Feb. 15, 2021, issued in corresponding PCT Application No. PCT/US2020/059012, Filed Nov. 5, 2020.
Molnar, Sabinus, "International Search Report" mailed Feb. 23, 2021, issued in corresponding PCT Application No. PCT/US2020/059017, Filed Nov. 5, 2020.
Molnar, Sabinus, "International Search Report" mailed Feb. 24, 2021, issued in corresponding PCT Application No. PCT/US2020/059023, Filed Nov. 5, 2020.
Contreras, Sampayo, J., "International Search Report" mailed Apr. 15, 2021, issued in corresponding PCT Application No. PCT/US2020/059028, Filed Nov. 5, 2020.
Kovacsovics, Martin, "International Search Report", mailed Mar. 1, 2021, issued in corresponding PCT Application No. PCT/US2020/059036, Filed Nov. 5, 2020.

* cited by examiner

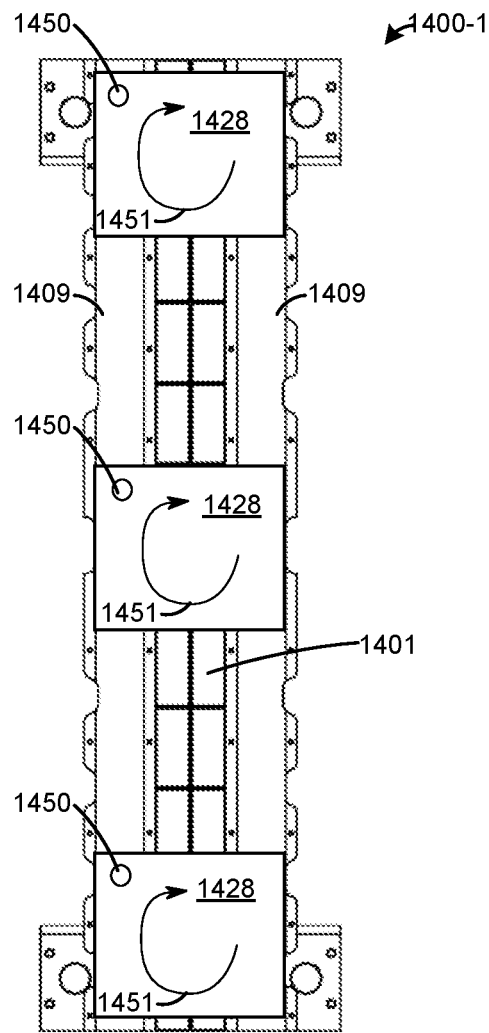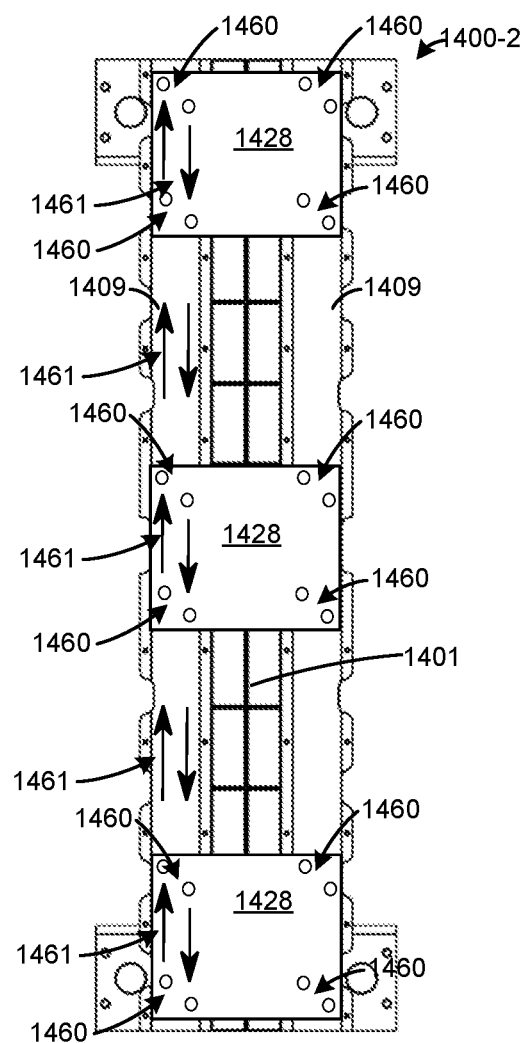
FIG. 9A
FIG. 9B

FORCE-PRODUCING ELECTROMAGNETIC MACHINE

CROSS-REFERENCE TO RELATED APPLICATIONS

This application claims priority from U.S. Provisional patent applications having Ser. Nos. 62/931,987, 62/931,935, 62/932,013, 62/932,077, 62/932,113, all of which were filed on Nov. 7, 2019, and the entire contents of which are incorporated herein by reference; this application further claims priority from U.S. Provisional patent application having Ser. No. 62/945,978, filed on Dec. 10, 2019, the entire contents of which is incorporated herein by reference.

BACKGROUND

The constraints of a transportation system that seeks to promote high speed, high efficiency, and high power density, impose challenges that are not present in the state of the art. In particular, such a transportation system may include an electromagnetic machine for generating force. Internal stress and heat production in such an electromagnetic machine may be problematic.

BRIEF DESCRIPTIONS OF THE DRAWINGS

For a better understanding of the various examples described herein and to show more clearly how they may be carried into effect, reference will now be made, by way of example only, to the accompanying drawings in which.

FIG. 8A, FIG. 8B, FIG. 8C and FIG. 8D respectively depict portions of electromagnetic machines having different retention mechanisms for retaining electrical windings, according to non-limiting examples.

FIG. 9A, and FIG. 9B, respectively depict portions of electromagnetic machines having retention mechanisms with, and without single point bonding, according to non-limiting examples.

Figure 10A:
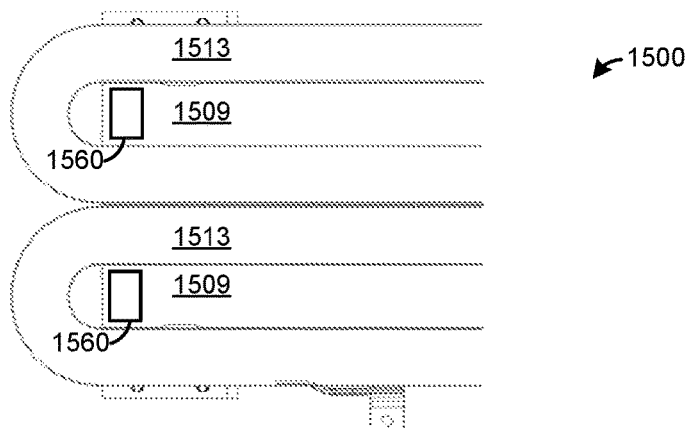
Figure 10B:
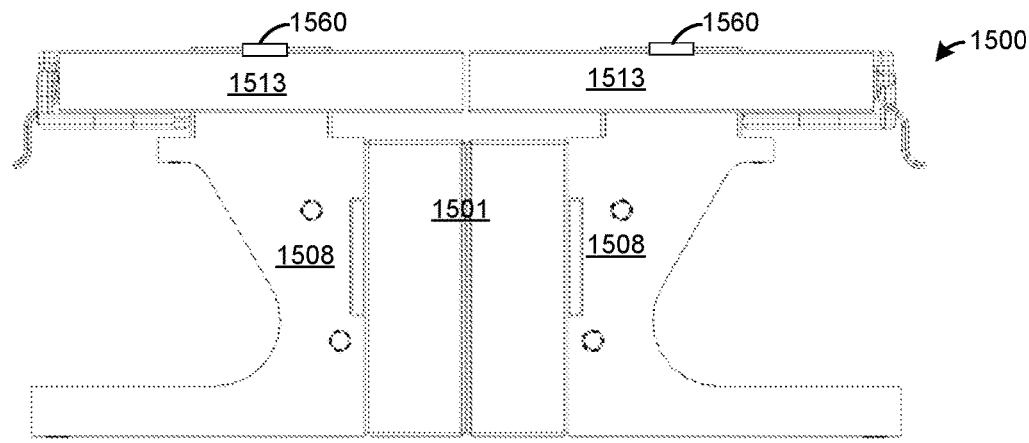
Figure 10C:
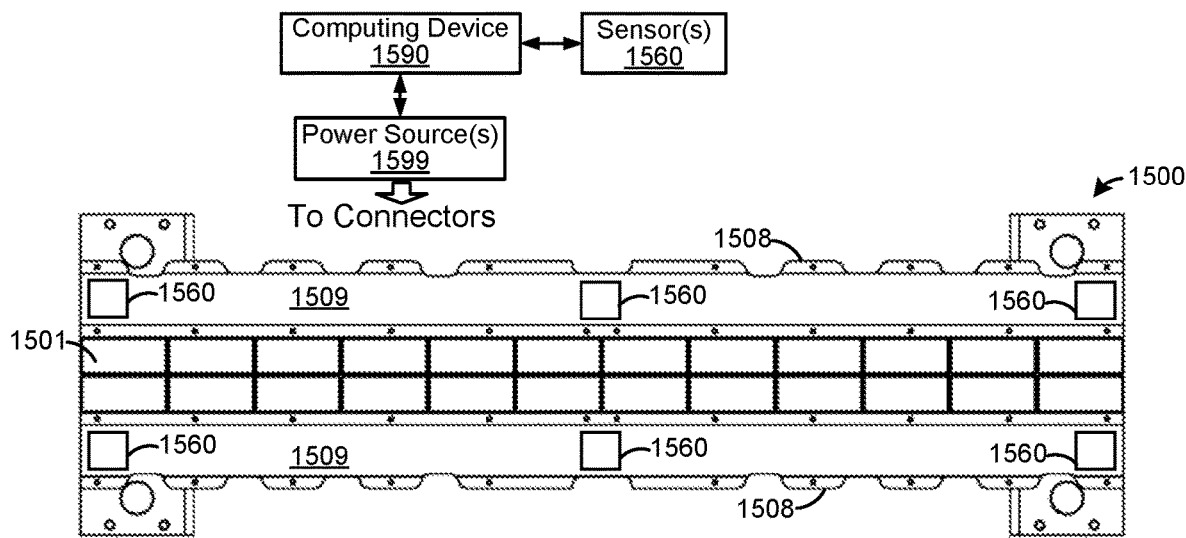

FIG. 10A, FIG. 10B, and FIG. 10C respectively depict: a top view of an end of an electromagnetic machine with magnetic flux sensors; an end view of the electromagnetic machine with magnetic flux sensors; and a top of the electromagnetic machine with magnetic flux sensors with electrical windings, and other components removed, according to non-limiting examples.

Figure 11A:
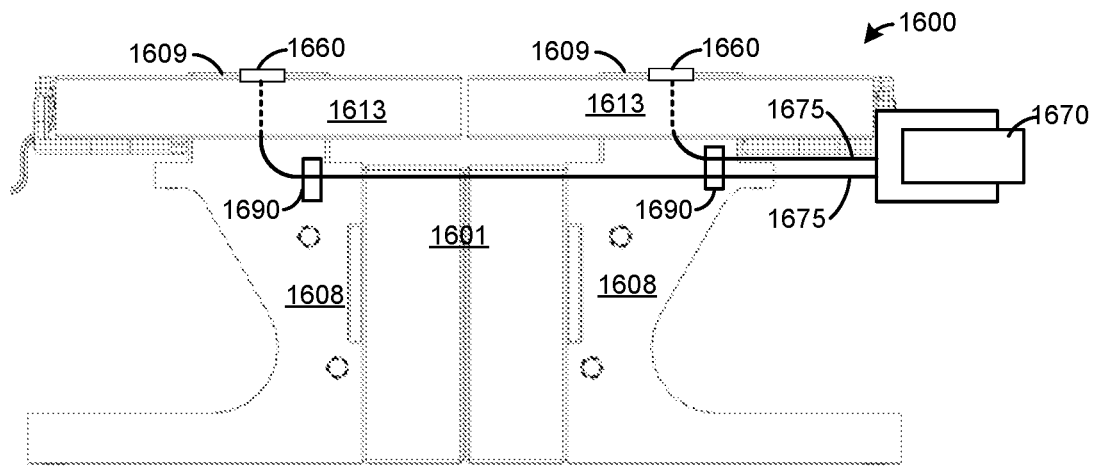
Figure 11B:
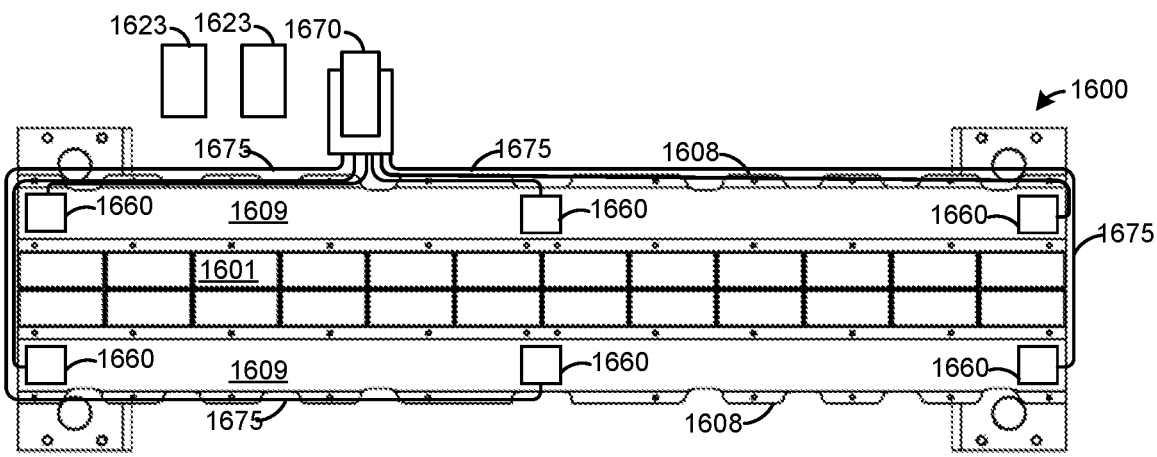

FIG. 11A and FIG. 11B respectively depict: an end view and a top view of an electromagnetic machine, the showing the electromagnetic machine with electrical windings, and other components removed; the electromagnetic machine includes magnetic flux sensors, a data connector and harnessing therebetween, according to non-limiting examples.

Figure 12A:
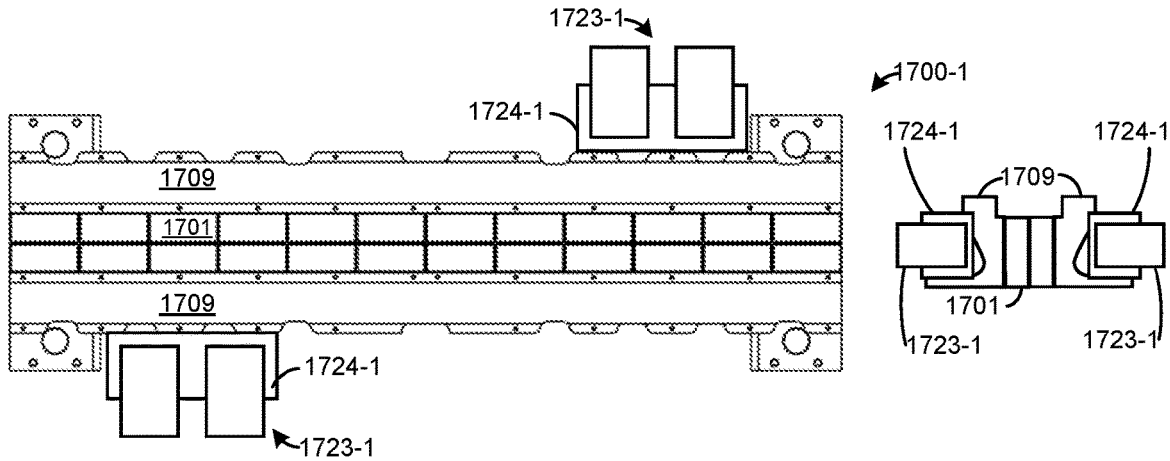
Figure 12B:
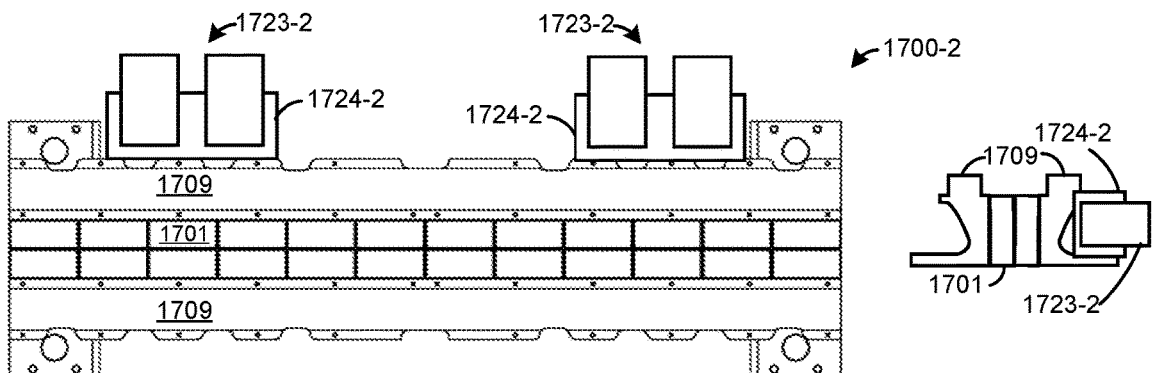
Figure 12C:
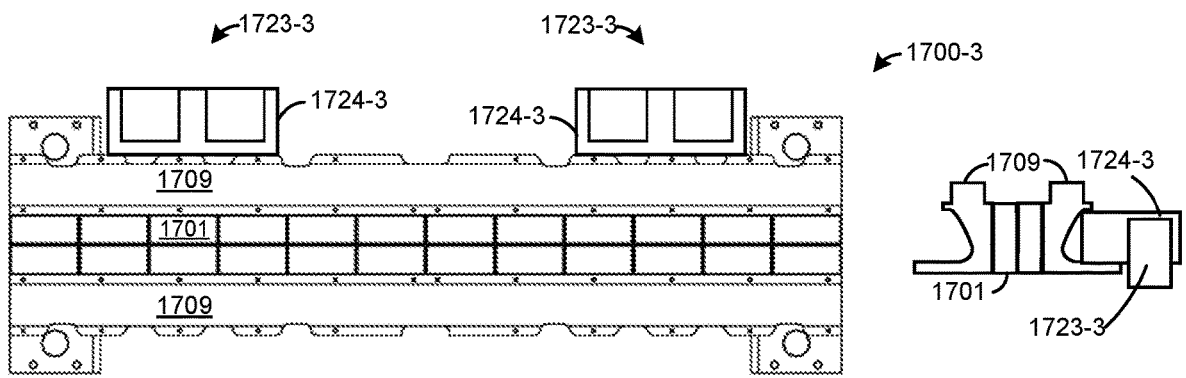

FIG. 12A, FIG. 12B, and FIG. 12C respectively depict portions of electromagnetic machines having different connectors to respective electrical windings, according to non-limiting examples.

Figure 13A:
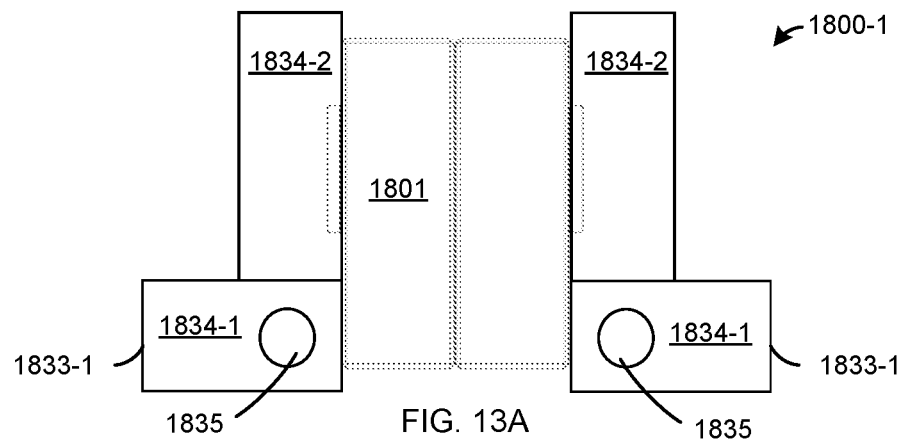
Figure 13B:
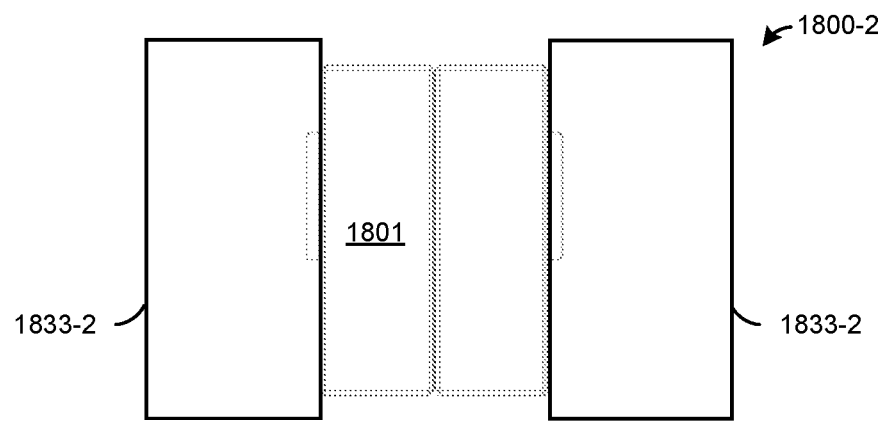
Figure 13C:
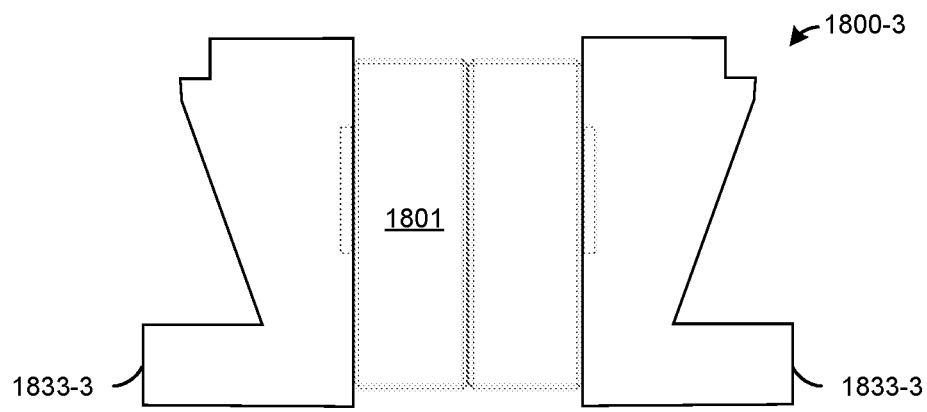

FIG. 13A, FIG. 13B, and FIG. 13C respectively depict end views of electromagnetic machines having different mounting devices, according to non-limiting examples.

Figure 14A:
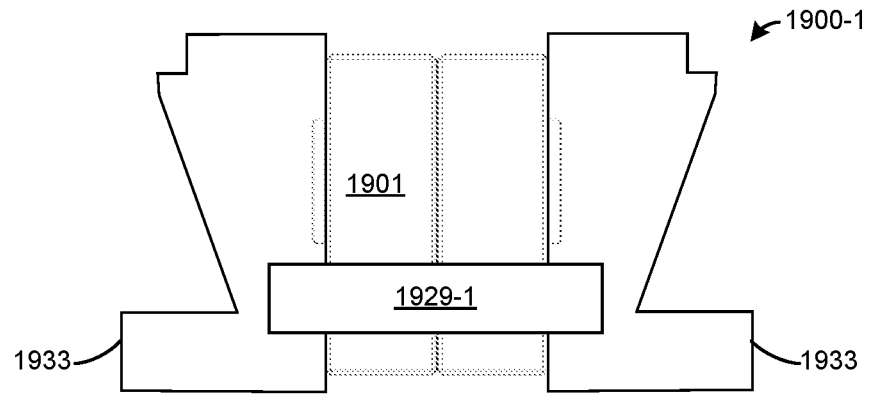
Figure 14B:
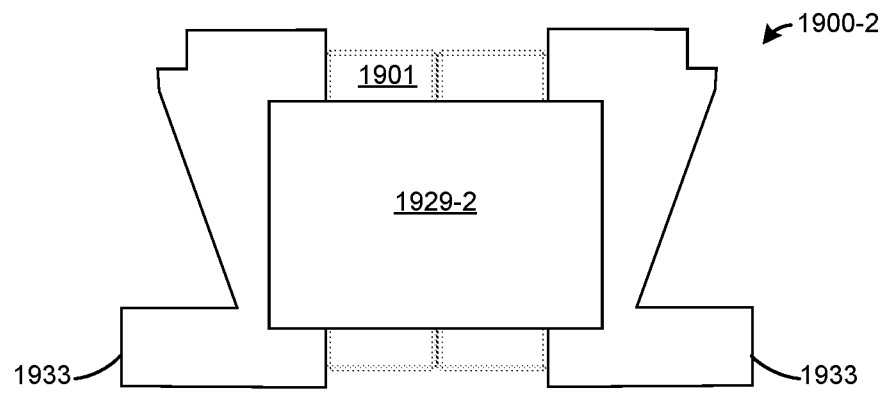
Figure 14C:
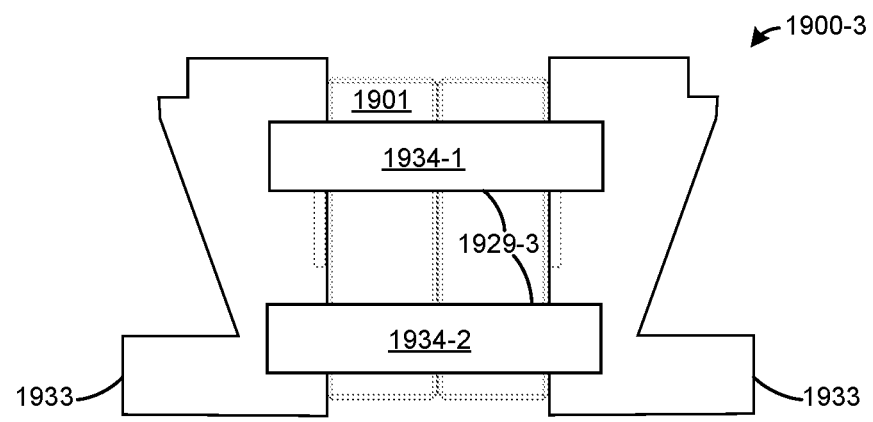

FIG. 14A, FIG. 14B, and FIG. 14C respectively depict end views of electromagnetic machines having different retention plates, according to non-limiting examples

DETAILED DESCRIPTION

The constraints of a transportation system that seeks to promote high speed, high efficiency, and high power density, impose challenges that are not present in the state of the art. In particular, such a transportation system may include an electromagnetic machine for generating force. Internal stress and heat production in such an electromagnetic machine may be problematic.

Provided herein is an electromagnetic machine that interacts with a track to provide forces which generally counteract gravitational and/or inertial loads, and other loads along a plurality of axes, of a pod and/or a vehicle to which the electromagnetic machine is attached. The electromagnetic machine includes a permanent magnet and at least one winding to produce a force between the electromagnetic machine and the track (which may alternatively be referred to as a rail), the track comprising ferromagnetic sections.

The electromagnetic machine provided herein, which may alternatively be referred to as an actuator and/or a force engine, may be a functional sub-component of an "electromagnetic suspension system" (EMS) used by the vehicle to generate forces in a plurality of directions (e.g. for lift, braking, and guidance and/or any other suitable functionality).

EMS-type systems rely on controls to stabilize their forces, which are generally unstable (attractive and increasing in proximity to the track).

Furthermore, lift, guidance, braking systems, and the like, may use considerable power; the force-producing electromagnetic machine provided herein may assist with reducing and/or minimizing power consumption in such lift, guidance, braking systems, and the like.

Apart from windings, the permanent magnets in the electromagnetic machine provided herein are the most fragile components. These magnets can be damaged by thermal, electromagnetic, and mechanical loads.

Precision in construction of the electromagnetic machine provided herein may be critical, since misalignment in actuators along a direction of force may require some actuators (in a multi-actuator system) to be permanently located at a distance from the track which is greater than the distance of closest-approach (an actuator nearest to a respective track). This may cause increased power consumption in those more distant actuators.

Hence, the electromagnetic machine provided herein may comprise at least one magnet and at least one winding. The at least one magnet is thermally isolated from the at least one winding by at least one cold plate, and the at least one magnet is mechanically isolated from the structure of ferromagnetic bodies which interact with a track to produce force; in particular, the at least one magnet is mechanically isolated from the ferromagnetic bodies via a reciprocal retention mechanism and/or device. The reciprocal retention device may comprise any suitable components which constrain movement of the at least one magnet, relative to the ferromagnetic bodies, in at least one direction.

The reciprocal retention device may include at least one locating feature which may be configured to allow the at least one magnet to be removed from the structure of ferromagnetic bodies.

The at least one magnet may comprise a plurality of magnet segments and may further comprise at least one structural and/or locating feature, which may comprise a plate, a pin, a bar, and the like, which retains the at least one magnet relative to the ferromagnetic bodies.

The at least one cold plate is configured to thermally isolate the magnet from the electrical windings. The at least one magnet may be located at a first side of at least one cold plate, and the electrical windings may be located at a second side of at least one cold plate. The electrical windings may be thermally and mechanically separate from the structure of the ferromagnetic bodies. For example, there may be a gap between the electrical windings and pole portions of the ferromagnetic bodies. Indeed, the electrical windings may be removable from the ferromagnetic bodies, hence such a gap may provide adequate mechanical clearance between the inner surfaces of the electrical windings and the outer pole surfaces; such clearance may reduce and/or eliminate intimate thermal contact directly between the electrical windings and the pole portions.

A ferromagnetic body may comprise a single structural component with accurately controlled surfaces at a track facing side (e.g. a pole face), and a mounting interface facing side.

Hence, an aspect of the present specification provides an electromagnetic machine for generating force, the electromagnetic machine comprising: a magnet having opposing sides extending along a longitudinal axis; a pair of ferromagnetic bodies respectively extending along the opposing sides of the magnet, and along the longitudinal axis, each of the ferromagnetic bodies comprising: a back-iron portion; and a pole portion extending from the back-iron portion; the magnet and the ferromagnetic bodies comprising reciprocal retention devices at the opposing sides along the longitudinal axis; electrical windings around respective pole portions of the ferromagnetic bodies, the electrical windings around the respective pole portions being independently controllable; and at least one cold plate configured to thermally isolate the magnet from the electrical windings. The cold plate may further thermally regulate the temperature of the electrical windings.

Figure 1:
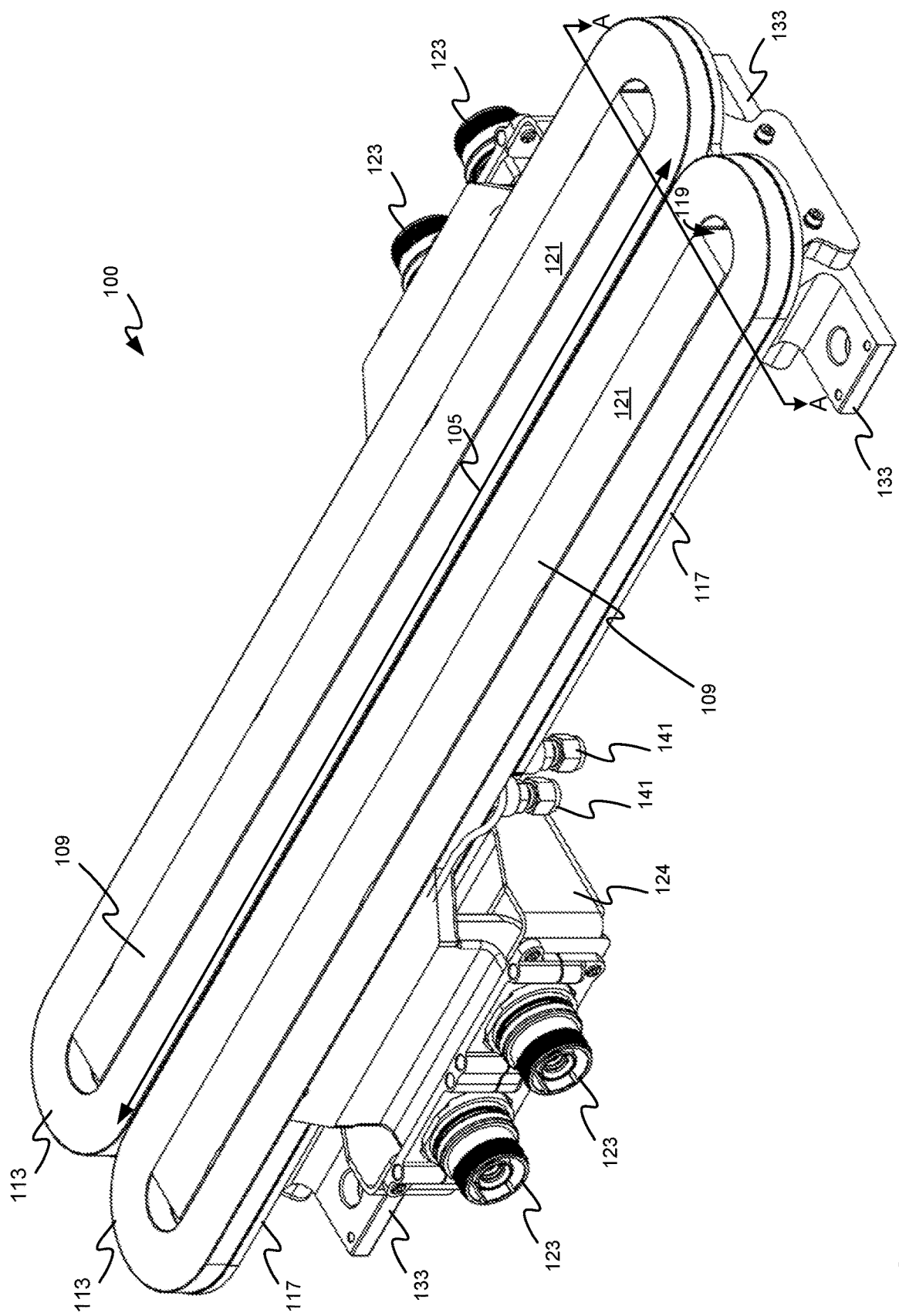
FIG. 1 depicts a perspective view of an electromagnetic machine for generating force, according to non-limiting examples.
Figure 2:
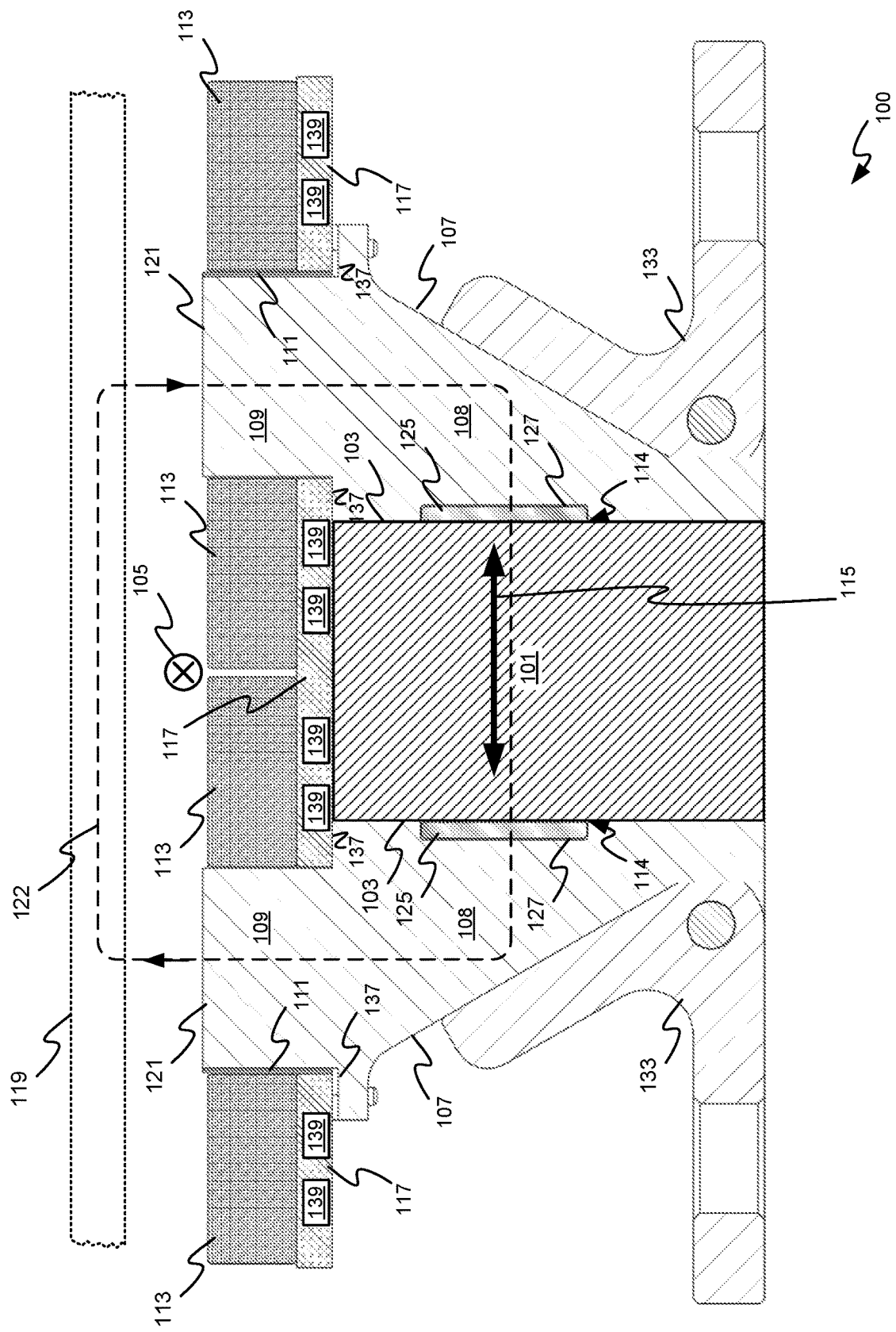
FIG. 2 depicts a partial cross-sectional view of the electromagnetic machine of FIG. 1 through the line A-A, according to non-limiting examples.
Figure 3:
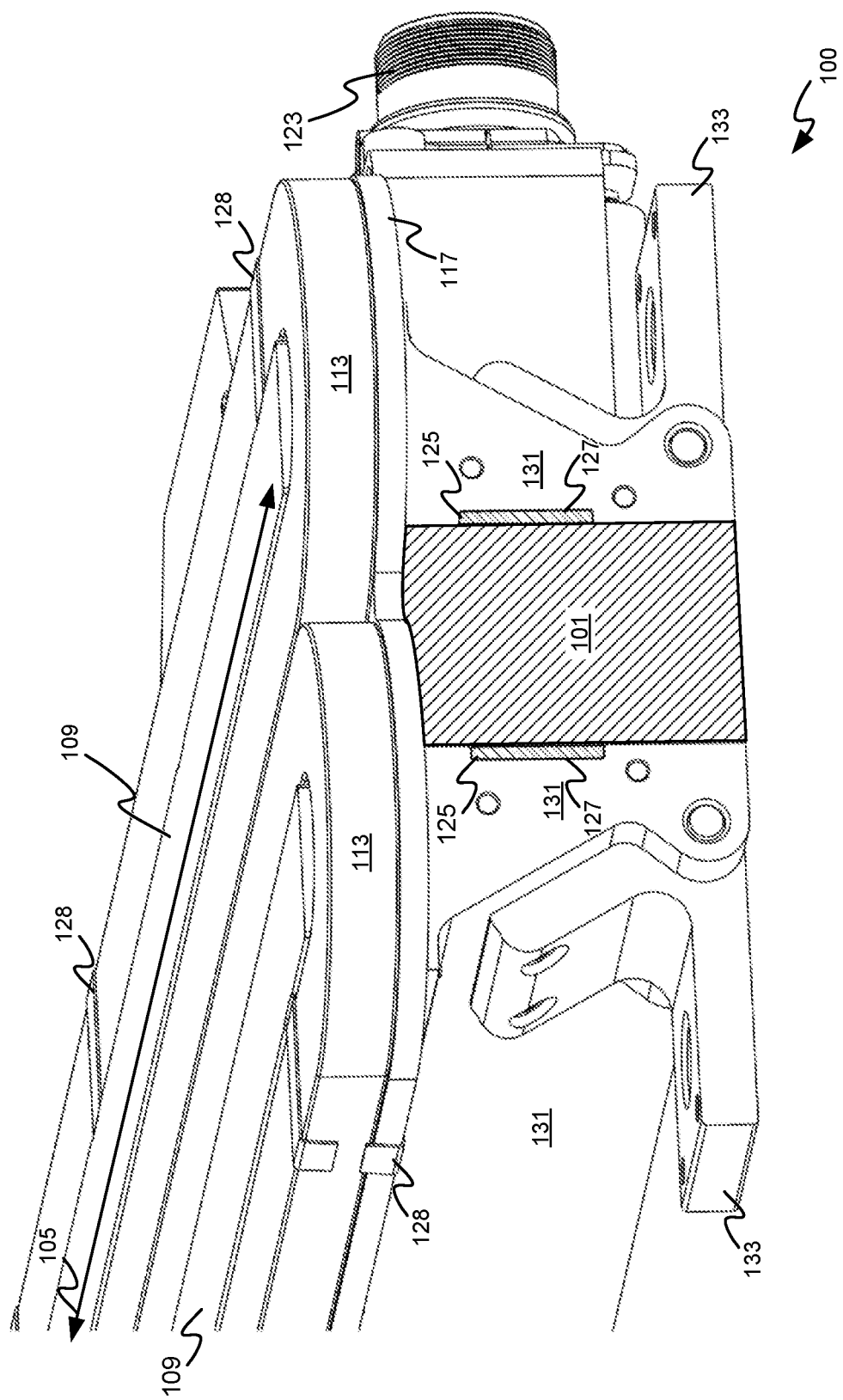
FIG. 3 depicts a perspective end view of the electromagnetic machine of FIG. 1 with retaining plate removed, according to non-limiting examples.

Attention is next directed to FIG. 1, FIG. 2, FIG. 3 and FIG. 3 which respectively depict: a perspective view of an electromagnetic machine 100 for generating force, a cross-sectional view of the electromagnetic machine 100 through the line A-A of FIG. 1, a perspective end view of the electromagnetic machine 100 with a retention plate removed; and a bottom view of the electromagnetic machine 100.

The electromagnetic machine 100 may comprise an electromagnetic machine for levitating (e.g. a levitation actuator), and one or more of the electromagnetic machines 100 and may be attached to a pod (e.g. a vehicle and/or payload), and the like, of a transportation system. For example, one or more of the electromagnetic machines 100 may be attached to a pod and/or vehicle and/or payload used in a high speed transportation system which may be deployed on land, underground, overland, overwater, underwater, and the like; a pod and/or vehicle and/or payload of the highspeed transport system may comprise a vehicle, and the like, for transporting cargo and/or passengers, and the like, and/or any other suitable payloads. One or more of the electromagnetic machines 100 may interact with a track of the transportation system and/or high speed transportation system, to levitate the pod and/or vehicle and/or payload relative to the track. For example, the track (e.g. of ferromagnetic material) may be mounted above the electromagnetic machine 100 and, in operation, the electromagnetic machine 100 may produce an upward force which counteracts gravitational pull on the electromagnetic machine 100, as well as the pod and/or vehicle and/or payload to which the electromagnetic machine 100 is attached. The track may be mounted in a tube, and/or at a wall, and the like, of the transportation system which may be partially evacuated. The pod and/or vehicle and/or payload may include further electromagnetic machines for propulsion, guidance and/or braking along respective tracks, in the tube.

The electromagnetic machine 100 comprises a magnet 101 (as best seen in FIG. 2) having opposing sides 103 extending along a longitudinal axis 105. The electromagnetic machine 100 further comprises a pair of ferromagnetic bodies 107 respectively extending along the opposing sides 103 of the magnet 101, and along the longitudinal axis 105, each of the ferromagnetic bodies 107 comprising: a back-iron portion 108; and a pole portion 109 extending from the back-iron portion 108 (as best seen in FIG. 2).

The magnet 101 and the ferromagnetic bodies 107, together comprise reciprocal retention devices 114 at the opposing sides 103 along the longitudinal axis 105. For example, a magnetized axis 115 of the magnet 101 may extend between the opposing sides 103, and the magnetized axis 115 may be perpendicular to the longitudinal axis 105. Hence, put another may, the magnet 101 and the ferromagnetic bodies 107, together comprise reciprocal retention devices 114 at the opposing sides 103 and perpendicular to a magnetized axis 115 of the magnet 101.

The electromagnetic machine 100 further comprises electrical windings 113 around respective pole portions 109 of the ferromagnetic bodies 107, the electrical windings 113 around the respective pole portions 109 being independently controllable.

The electromagnetic machine 100 further comprises at least one cold plate 117 configured to thermally isolate the magnet 101 from the electrical windings 113.

While not depicted, the magnet 101 may be segmented. For example, the magnet 101 may comprise a plurality of segments of magnetic material (e.g. magnetic segments). The magnetic segments may be retained relative to each other via magnetic attraction therebetween, and/or via retention devices (e.g. of a frame of the electromagnetic machine 100, described in more detail below). Such a configuration may reduce cost as producing many smaller segments of magnetic material may be less expensive, with fewer rejects, than when producing one larger magnet. However, the magnet 101 may also comprise a solid, and/or non-segmented, magnet.

The ferromagnetic bodies 107 may generally be solid and/or integrated; put another way each ferromagnetic body 107 may generally be formed as a single piece of ferromagnetic material. However, in other examples, one or more of the ferromagnetic bodies 107 may be segmented and/or laminated.

The ferromagnetic bodies 107 generally extend along the opposing sides 103 of the magnet 101 to provide a flux path 122 through the magnet 101 and around the ferromagnetic bodies 107, as well as through a track 119, schematically depicted in FIG. 2 in broken lines, to generate a force on the electromagnetic machine 100 relative to the track 119 for example to actuate a pod and/or vehicle and/or payload at which the electromagnetic machine 100 is mounted, as described above. In some examples, the track 119 may be located above pole faces 121 of the pole portions 109 and the flux may flow from a first ferromagnetic body 107, through the magnet 101 to a second ferromagnetic body 107, through a gap between a pole face 121 of the second ferromagnetic body 107, through the track and back through the gap between a pole face 121 of the first ferromagnetic body 107, and back to the magnet 101. The flux disposed along, and/or in, the flux path 122 generally results in attractive force between the pole faces 121 and the track 119. As an electromagnetic machine for propulsion, attached to the pod and/or vehicle and/or payload to which the electromagnetic machine 100 is attached, may cause the electromagnetic machine 100 to move relative to the track 119 (e.g. in a direction about perpendicular to the longitudinal axis 105), at least the pole faces 121 are generally machined to a suitable degree of precision (e.g. flatness) such that at the pole faces 121 an about constant distance is maintained between the electromagnetic machine 100 and the track 119.

A direction of the flux along path 122 is generally determined by a pole of the magnet 101.

The flux may be controlled by the electrical windings 113, for example via respective pairs of connectors 123 (best seen in FIG. 1 and FIG. 4)); in particular, the pairs of connectors 123 are generally configured to electrically connect to a power source (e.g. as located at the pod and/or vehicle and/or payload) for driving respective electrical windings 113. As depicted, the electromagnetic machine 100 may further comprise one or more trays 124 for removably receiving the electrical connectors 123. The trays 124 may support the electrical connectors 123 and may be attached thereto using any suitable fasteners. In some examples, one or more of the trays 124 may be attached to, and/or integrated with, a frame (described below) of the electromagnetic machine 100, and/or one or more of the trays 124 may be attached to, and/or integrated with, a cold plate 117 of the electromagnetic machine 100.

As different pairs of connectors 123 are provided for each of the electrical windings 113, the electrical windings 113 are independently controllable and/or powered; hence, when one electrical winding 113 fails, operation of the electromagnetic machine 100 may continue by continuing to operate the other electrical winding 113.

Returning to FIG. 2, the back-iron portions 108 of the ferromagnetic bodies 107 may be chamfered at respective opposite sides 103 the magnet 101. Such chamfering may assist in direction magnetic flux around the path 122 and/or change the magnetic flux density along the path 122, for example to collect and increase the magnetic flux density in the gap between the pole faces 121 and the track 119.

As also best seen in FIG. 2, as depicted, the reciprocal retention devices 114 may comprise respective rib-and-slot structures at the opposing sides 103 along the longitudinal axis 105 (and/or perpendicular to a magnetized axis 115 of the magnet 101), ribs 125 and slots 127, of the respective rib-and-slot structures, being complementary to each other. For example, as depicted, the ribs 125 may comprise ferromagnetic (and/or magnetic) material which extends along respective opposing sides 103 of the magnet 101, and may be attached to the magnet 101 via adhesive, and the like, and/or any other suitable mechanism. As depicted, the ferromagnetic bodies 107 may have respective slots 127 (e.g. and/or grooves), that are complementary to the ribs 125, machined along magnet-facing sides of the back-iron portions 108. Magnetic attraction (e.g. magnetic force) between the magnet 101 and the ferromagnetic material of the ferromagnetic bodies 107 generally hold the magnet 101 and the ferromagnetic bodies 107 in place relative to each other, for example with respect to the path 122.

Figure 4:
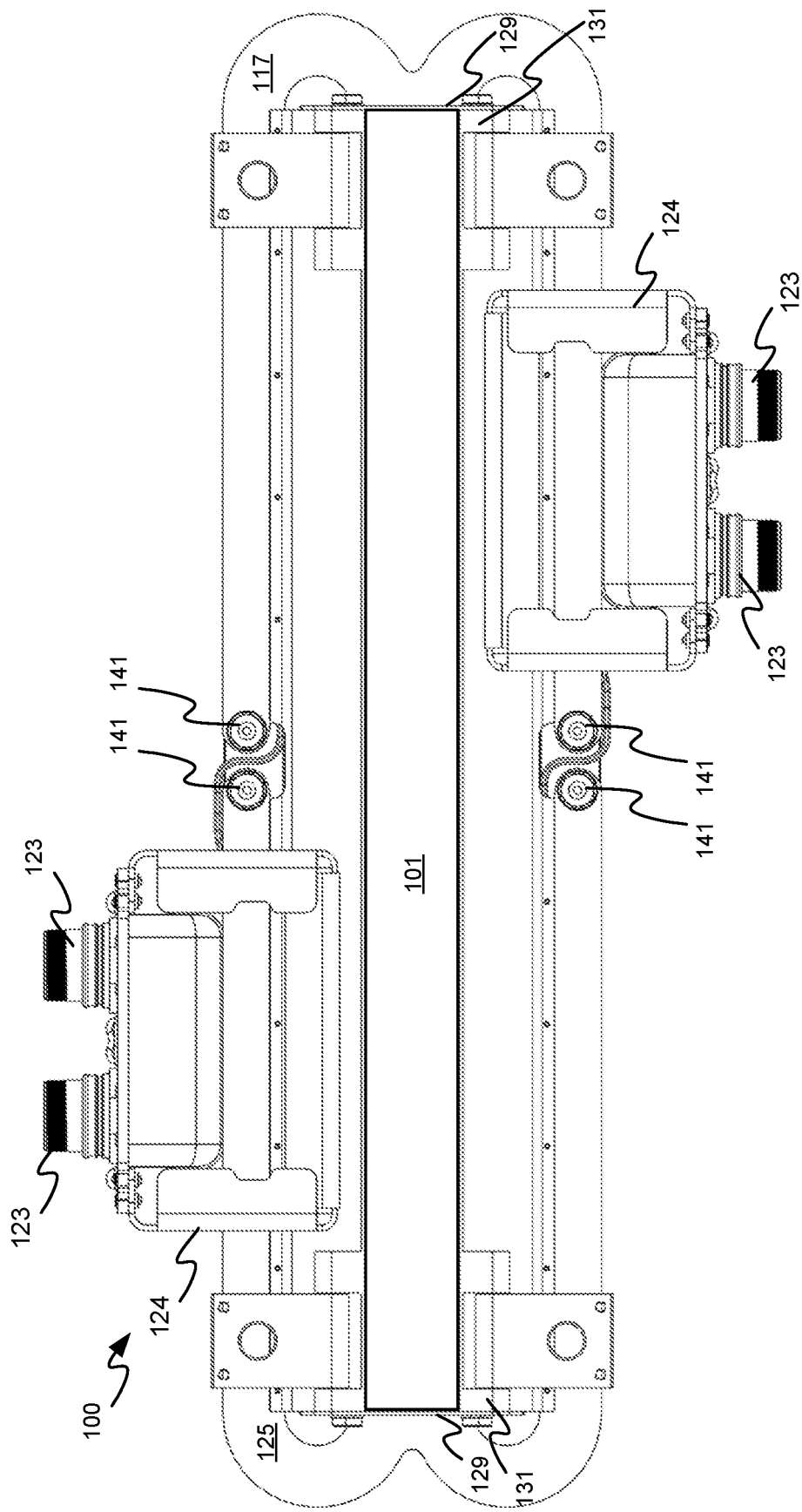
FIG. 4 depicts a bottom view of the electromagnetic machine of FIG. 1, according to non-limiting examples.
Figure 5:
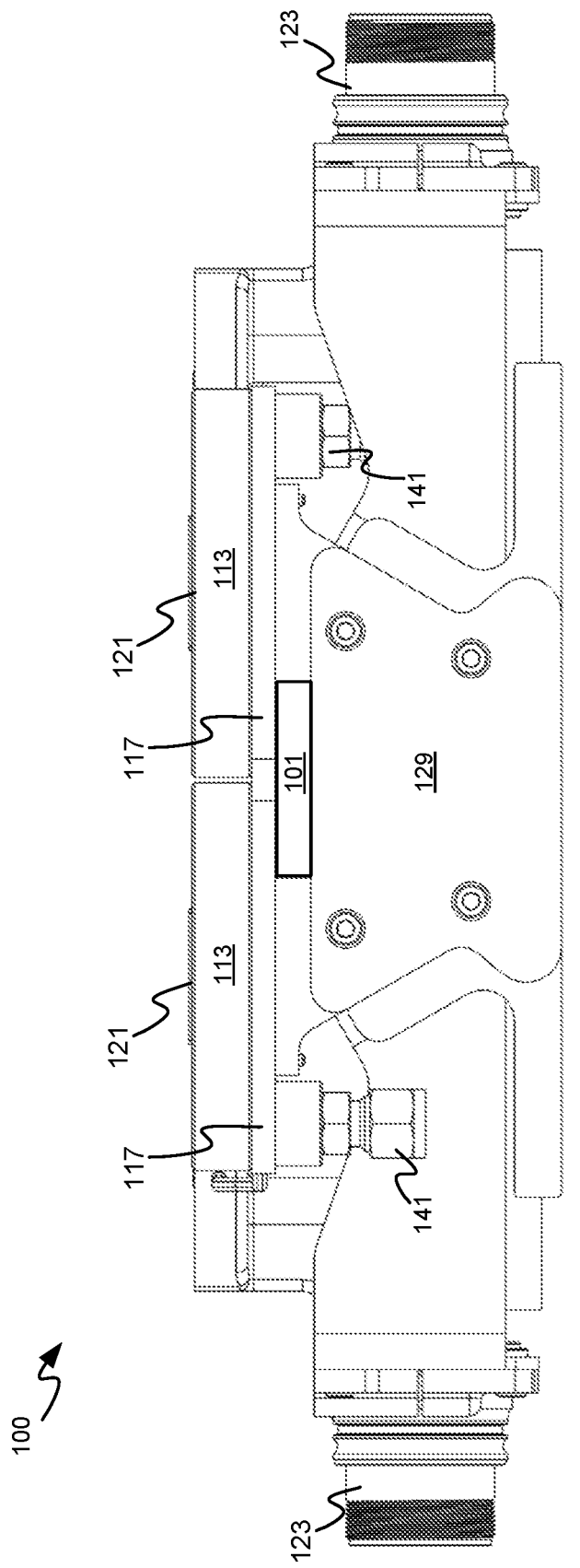
FIG. 5 depicts an end view of the electromagnetic machine of FIG. 1 with a retaining plate in place, according to non-limiting examples.

With brief reference to FIG. 4, which depicts a bottom view of the electromagnetic machine 100, and FIG. 5, which depicts an end view of the electromagnetic machine 100, retention plates 129 may be located at longitudinal ends of the magnet 101. Put another way, retention plates 129 may be located at opposite ends of the longitudinal axis 105, the retention plates 129 configured to hold the magnet 101 between the ferromagnetic bodies 107. In some examples, the retention plates 129 may be attached to the back-iron portions 108 of the ferromagnetic bodies 107 at the opposite ends of the longitudinal axis 105, for example via bolts, and/or any other suitable fastener. In other examples, as depicted, the electromagnetic machine 100 may further comprise a frame 131 which may assist in supporting the magnet 101 and/or the ferromagnetic bodies 107 and/or other components of the electromagnetic machine 100; in these examples, the retention plates 129 may be attached to the frame 131 at the opposite ends of the longitudinal axis 105. In yet further examples, as depicted, the electromagnetic machine 100 may further comprise mounting devices 133, located at the opposite ends of the longitudinal axis 105, and which may be attached to the frame 131, the mounting devices 133 configured to attach the electromagnetic machine 100 to a pod and/or vehicle and/or payload; in some of these examples, the retention plates 129 may be attached to the mounting devices 133 at the opposite ends of the longitudinal axis 105. However, the retention plates 129 may be attached to any suitable component of the electromagnetic machine 100.

Furthermore, such retention plates 129 may be replaced with any suitable structural and/or locating feature, such as one or more of a pin, a bar, and the like, which retains the at least one magnet 101 relative to the ferromagnetic bodies 107.

Hence, mechanical constraints for the magnet 101 and the ferromagnetic bodies 107 use no adhesive and/or mechanical hardware in an interface between the magnet 101 and the ferromagnetic bodies 107. Indeed, constraints for the magnet 101 and the ferromagnetic bodies 107 may comprise magnetic force produced by an assembly of the magnet 101 and the ferromagnetic bodies 107. For example, the magnet 101 may hold itself in the slots 127, which may prevent the 101 from moving in directions perpendicular to the magnetized axis 115 of the magnet 101 extending between the opposing sides 103. Indeed, the rib 125 and slot 127 mechanism generally provides constraints in two degrees of freedom; for examples, the rib 125 and slot 127 mechanism generally constrains movement along both a direction of the magnetized axis 115 extending between the opposing sides 103, and directions perpendicular thereto. The magnetic force between the magnet 101 and the ferromagnetic bodies 107 may further constrain rotational movement about these directions such that the rib 125 and slot 127 mechanism, together with the magnetic force, further provides constraint for two additional degrees of freedom. Indeed, constraint is also placed on rotation about the longitudinal axis 105. Yet further constraint is placed on translational movement of the magnet 101 along the longitudinal axis 105 by the retention plates 129, and the like, which may be removed to permit separation of the magnet 101 from the ferromagnetic bodies

107, thus allowing for repair and/or replacement and the magnet 101 (e.g. when a retention plate 129 is removed, the magnet 101 may be translated along the longitudinal axis 105 to remove and/or replace the magnet 101. Hence, the rib 125 and slot 127 structure, and the magnetic attraction of the magnet 101 to the back-iron portions 108, may generally constrain all translations and rotations except for longitudinal translation, and the retention plates 129 may provide constraint on the longitudinal translation.

In some examples, as best seen in FIG. 3, components of the frame 131 may be located at the opposing ends of the longitudinal axis 105, and the rib 125 and slot 127 structure may extend into such components. Indeed, the frame 131 may comprise a plurality of mechanical components (e.g. of non-ferromagnetic material) which may be mechanically assembled with the magnet 101 and/or the ferromagnetic bodies 107 and/or other components of the electromagnetic machine 100. In some examples, the frame 131 may comprise the trays 124 and/or the trays 124 may be attached to the frame 131.

Hence, in general, mechanical stress may be reduced on the magnet 101, relative to electromagnetic machines 100 where a magnet uses adhesive, and/or mechanical hardware, and the like, to attach a magnet to a ferromagnetic body, as the magnet 101 is generally mechanically floating between the ferromagnetic bodies 107. For example, the magnet 101 is not mechanically attached to the ferromagnetic bodies 107. The retention plates 129 assist with the magnet 101 slipping out of longitudinal ends of the electromagnetic machine 100.

Returning to the ribs 125 and slots 127, the ribs 125 may be referred to as being keyed into respective complementary slots 127; for example, between the magnet 101 and the ferromagnetic bodies 107, a rib 125 "keys" into a complementary and/or reciprocal slot 127.

As depicted, the ribs 125 are located along respective opposing sides 103 of the magnet 101, and the slots 127 are located along respective back-iron portions 108 of the ferromagnetic bodies 107 (e.g. along respective magnet-facing sides of the back-iron portions 108 of the ferromagnetic bodies 107). Put another way, in these examples, the ribs 125 may be located along the opposing sides 103 of the magnet 101, the ribs 125 comprising ferromagnetic material attached to the magnet 101, and the slots 127 may be located along the back-iron portions 108 of the ferromagnetic bodies 107.

However, in other examples, the opposing sides 103 of the magnet 101 may be machined to include slots, similar to the slots 127, and complementary ribs, similar to the ribs 125, may be provided at along respective back-iron portions 108 of the ferromagnetic bodies 107 (e.g. along respective magnet-facing sides of the back-iron portions 108 of the ferromagnetic bodies 107). Put another way, the slots 127 may be located along the opposing sides 103 of the magnet 101, and the ribs 125 may be located along the back-iron portions 108 of the ferromagnetic bodies 107.

While as depicted the ribs 125 and slots 127 have complementary rectangular profiles and/or cross-sections, the ribs 125 and slots 127 have any suitable complementary profile and/or cross-section.

However, any reciprocal retention device is within the scope of the present specification. For example, the ribs 125 and slots 127 may be continuous or non-continuous along the magnet 101 and the ferromagnetic bodies 107. Similarly, the ribs 125 and/or slots 127 may be replaced with pins and complementary holes (e.g. having a depth similar to a length of a complementary pin), and the like.

The at least one cold plate 117 is next described in more detail. For example, attention is again directed to FIG. 2 which depicts that the at least one cold plate 117 is located between the electrical windings 113 and the magnet 101. Put another way, the magnet 101 may be located at a first side of at least one cold plate 117, and the electrical windings 113 may be located at a second side of at least one cold plate 117, the second side opposite the first side.

In particular for example, the at least one cold plate 117 may reside on respective ledges 137 of back-iron portions 108 of the ferromagnetic bodies 107. For example, the at least one cold plate 117 is positioned on ledges 137 of the back-iron portions 108 (e.g. a corner is formed by a ledge 137 and an external side 111 of a pole portion 109), and the electrical windings 113 are located on the at least one cold plate 117. As depicted, the at least one cold plate 117 is attached to the ledges 137 via any suitable fasteners (e.g. as depicted bolts, and the like).

The electrical windings 113 may be removably attached to the at least one cold plate 117 via any suitable retention mechanism, for example straps (e.g. see straps 128 in FIG. 3; in FIG. 1 and FIG. 2 such straps 128 are removed for simplicity), and the like, around the electrical windings 113 and the at least one cold plate 117. In some examples, an electrical winding 113 may be removeable and/or replaceable by removing the retention mechanisms (e.g. straps), detaching connectors 123 from the trays 124, and lifting the electrical winding 113 over a respective pole portion 109 (e.g. an aperture of an electrical winding 113 and a respective pole portions 109 may have parallel sides such that the electrical winding 113 easily slides past the pole portion 109). A new electrical winding 113 may be attached to the electromagnetic machine 100 using the same process in reverse.

In any event, as the at least one cold plate 117 is located between the electrical windings 113 and the magnet 101, the magnet 101 may be thermally isolated from the electrical windings 113 which may be the component of the electromagnetic machine 100 which generates the most thermal energy. Indeed, when the magnet 101 is exposed to thermal energy, and heats up, its magnetic properties degrade; while such degradation may be compensated for by increasing power to the electrical windings 113, for example to counteract a decrease in magnetic flux due to degradation of the magnetic properties of the magnet 101, such an increase in power decreases electrical efficiency of the electromagnetic machine 100 and may lead to yet more thermal energy being generated by the electrical windings 113, which may lead to yet further degradation of the magnetic properties of the magnet 101. Hence, the cold plate 117 may assist with reducing such degradation and/or decreasing power usage at the electromagnetic machine 100.

With attention directed to FIG. 1 and FIG. 2, the at least one cold plate 117 may comprise one or more cooling channels 139 and connectors 141 to connect the one or more cooling channels 139 to a liquid coolant supply (e.g. as located at the pod). A liquid coolant pump, and the like (e.g. as located at the pod), may pump liquid coolant through the cooling channels 139 via the connectors 141.

In some examples, however, the cold plate 117 may be replaced with a plate which may or may not provide cooling functionality. While, hereafter, references are made to a cold plate 117, the term "cold plate" may be replaced throughout with the term "plate" and/or "plate with cooling functionality". For example, a plate with, or without cooling functionality may also have electrical winding retaining functionality, for example as described below with regards to FIG. 6. In some examples, such a plate and/or the cold plate 117, may comprise ferromagnetic material to provide magnetic functionality to the plate (e.g. such a plate and/or the cold plate 117, may function as part of the ferromagnetic bodies 107).

Figure 6:
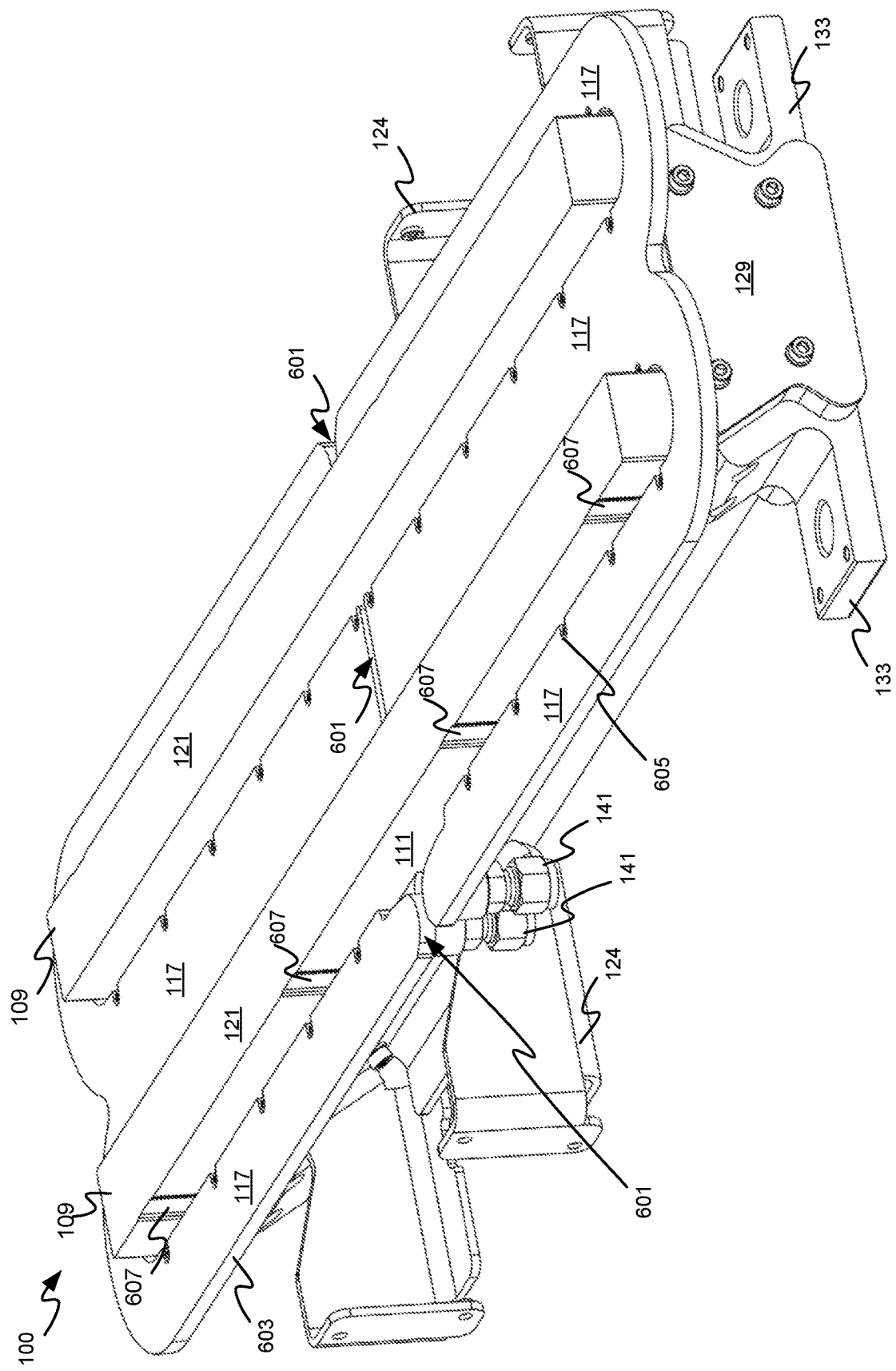
FIG. 6 depicts a perspective view of the electromagnetic machine of FIG. 1 with replaceable windings removed, according to non-limiting examples.

Attention is next directed to FIG. 6 which depicts a perspective view of the electromagnetic machine 100 with the electrical windings 113 removed, for example to show a structure of the at least one cold plate 117. In particular, as depicted, the at least one cold plate 117 comprises two cold plates 117 around the two pole portions 109, each of the cold plates 117 being a "W" shape and/or an "M" shape and/or an "E" shape.

In particular, the at least one cold plate 117 comprises a gap 601 extending between an external edge 603 of the at least one cold plate 117 and a pole portion 109 to interrupt eddy currents in the at least one cold plate 117 around the pole portions 109. Indeed, as depicted, the gap 601 is formed where the two cold plates 117 meet and/or are closest to each other (e.g. the term "meet" is not meant to imply that the two cold plates 117 touch). Put another way, the at least one plate 117 (e.g. a cold plate 117) comprises a gap 601 disposed along a direction substantially perpendicular to a flow of current in a coil a the replaceable winding 113, such that the at least one plate 117 is not contiguous around the pole portion 109. Put yet another way, the at least one plate 117 comprises a gap 601, such that the at least one plate 117 is discontinuous around the pole portion 109. Put yet another way, the at least one plate 117 is interrupted by a gap 601 which is disposed between an external edge of the at least one plate 117 and the pole portion 109, to interrupt eddy currents in the at least one plate 117 around the pole portion 109.

In FIG. 6, example positions of bolts 605 attaching the at least one cold plate 117 to the ledge 137 are also depicted.

In FIG. 6, details of the tray 124 in the absence of the electrical connectors 123 is also depicted.

FIG. 6 further depicts relief cuts 607 along on external sides 111 of the pole portions 109. While not depicted, the relief cuts 607 extend along corresponding regions of the ledge 137. In general, the relief cuts 607 are configured to receive the straps 128 (e.g. at least one removeable retention mechanism to removably retain the electrical windings 113 at the pole portions 109). While FIG. 6 depicts four relief cuts 607 (e.g. for as many as five straps) the electromagnetic machine 100 may include more than four or fewer than four relief cuts 607. Furthermore, not all the relief cuts 607 may be provided with a strap.

Figure 7:
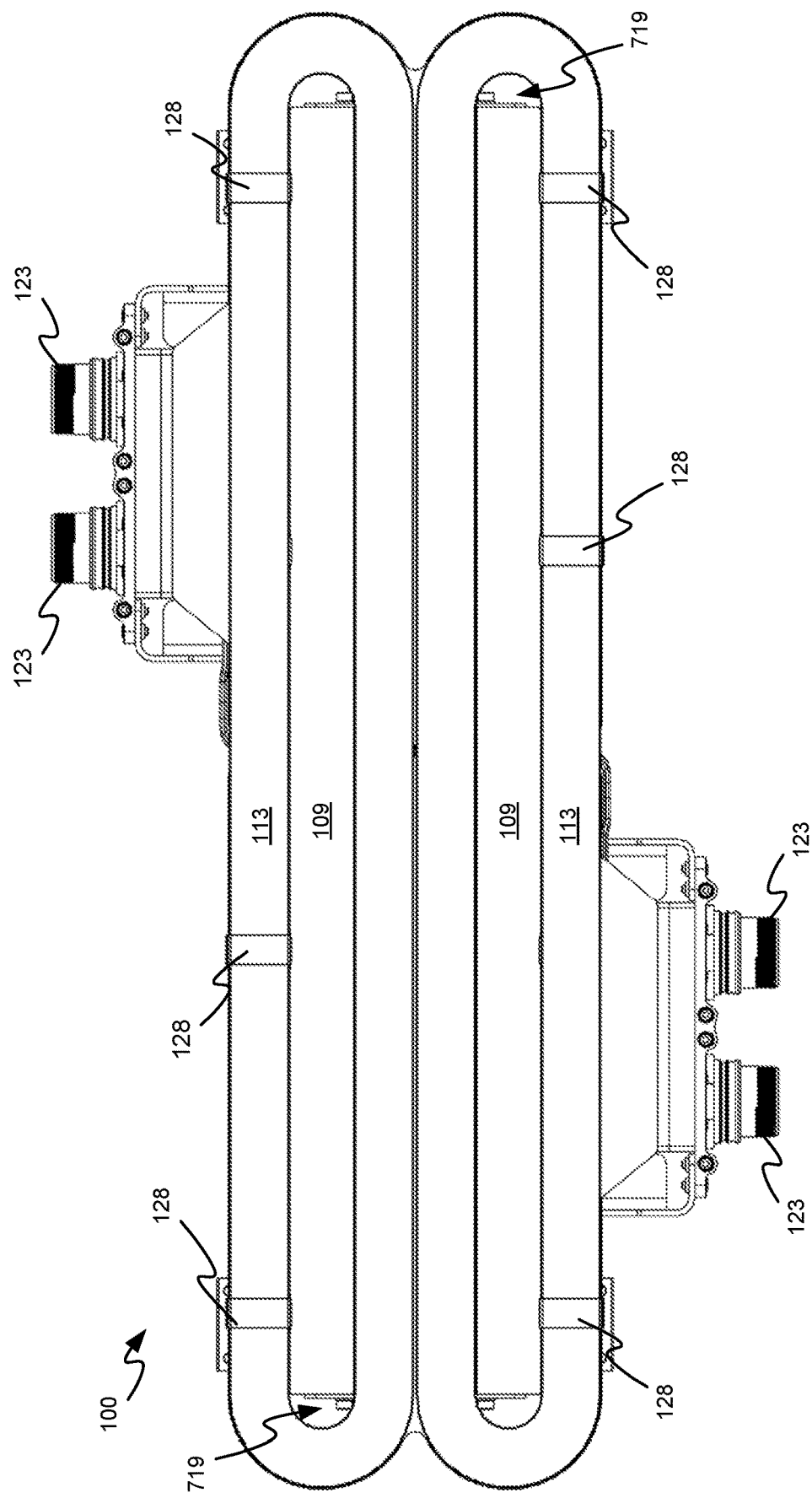
FIG. 7 depicts a top view of the electromagnetic machine of FIG. 1, according to non-limiting examples.

Attention is next directed to FIG. 7 which depicts a top view of the electromagnetic machine 100 and shows the position of the electrical windings 113 relative to the pole portions 109, as well as the connectors 123. FIG. 7 further shows example positions of the straps 128. In particular, FIG. 7 further shows that respective sides of the electrical windings 113 (e.g. sides apertures 719 therethrough) and the pole portions 109 are about parallel to one another.

Other examples and/or embodiments are within the scope of the present specification.

For example, attention is next directed to FIG. 8A, FIG. 8B, FIG. 8C, and FIG. 8D which depict examples of portions of electromagnetic machines 1300-1, 1300-2, 1300-3, 1300-4 having retention mechanisms different from the straps 128. For example, the electromagnetic machine 1300-1 comprises one or more retention mechanisms 1328-1, the electromagnetic machine 1300-2 comprises one or more retention mechanisms 1328-2, the electromagnetic machine 1300-3 comprises one or more retention mechanisms 1328-3, and the electromagnetic machine 1300-4 comprises one or more retention mechanisms 1328-4A, 1328-4B.

The electromagnetic machines 1300-1, 1300-2, 1300-3, 1300-4 are interchangeably referred to hereafter, collectively, as the electromagnetic machines 1300 and, generically, as an electromagnetic machine 1300. This convention will be used hereafter. For example, the retention mechanisms 1328-1, 1328-2, 1328-3, 1328-4A, 1328-4B are referred to hereafter as the retention mechanisms 1328 and/or as a retention mechanism 1328.

To better show details of the retention mechanisms 1328, in each of FIG. 8A, FIG. 8B, FIG. 8C, and FIG. 8D, a respective left hand side shows a top view of an end of an electromagnetic machine 1300, with electrical connectors (e.g. similar to the connectors 123), removed while a respective right hand side shows an end view of an electromagnetic machine 1300, with retention plates (e.g. similar to the retention plates 129) removed.

As depicted, the electromagnetic machines 1300 comprise respective magnets 1301, respective pole portions 1309, respective electrical windings 1313 around the respective pole portions 1309, and cold plates 1317, which are respectively similar to magnet 101, the pole portions 109, the electrical windings 113 and cold plates 117 of the electromagnetic machine 100. However, as depicted, the magnets 1301 are segmented. Similarly, as will next be described, the retention mechanisms 1328 are different from the straps 128. The electromagnetic machines 1300 are understood to be otherwise similar to the electromagnetic machine 100.

While in the depicted examples, only one respective retention mechanism 1328 is depicted at each of the electromagnetic machines 1300, for example at one respective end thereof, it is understood that an electromagnetic machine 1300 may comprise any suitable number of respective retention mechanisms 1328. For example, the electromagnetic machines 1300 may comprise one or more respective retention mechanisms 1328 along a longitudinal axis thereof (e.g. similar to the longitudinal axis 105); in a particular example, the electromagnetic machines 1300 may comprise at least three retentions mechanisms 1328, one at each end of the pole portions 1309, and one at about the middle of the pole portions 1309.

Furthermore, the retention mechanisms 1328 may comprise any suitable material which may be electrically conducting and/or ferromagnetic, or an insulator. The retention mechanisms 1328, when ferromagnetic, may assist with shaping magnetic flux and/or a magnetic flux path (e.g. as described with respect to FIG. 2). Furthermore, a gap between an electromagnetic machine 1300 and a track (e.g. the track 119) may be maintained taking into account any additional height added to pole faces due to presence of the retention mechanisms 1328.

Furthermore, while not depicted, the retention mechanisms 1328 are understood to be attached to the electromagnetic machines 1300 using any suitable devices and/or fasteners and/or mechanisms to assist the retention mechanisms 1328 with retaining the electrical windings 1313, and optionally the cold plates, to the electromagnetic machines 1300.

Figure 8A:
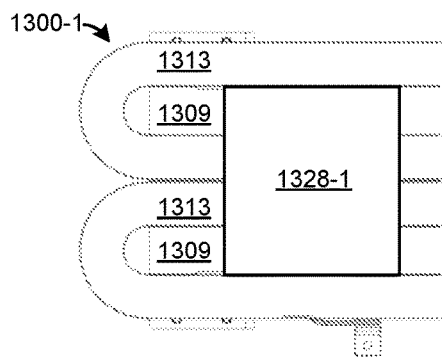
Figure 8A:
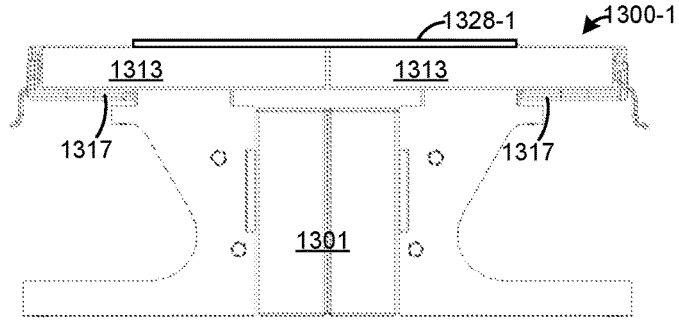

With attention next directed to FIG. 8A, the retention mechanism 1328-1 is understood to include a plate attached to respective pole faces of the pole portions 1309, and which extends across at least a portion of the electrical windings 1313. Hence, for example, the retention mechanism 1328-1 is understood to be attached to both pole portions 1309 and across the electrical windings 1313 between the pole portions 1309. Furthermore, while as depicted the retention mechanism 1328-1 is square in shape, the retention mechanism 1328-1 may have any suitable shape.

Figure 8B:
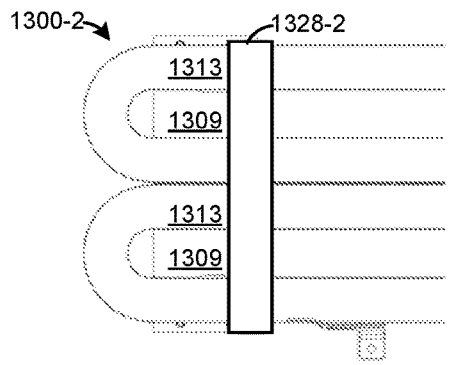
Figure 8B:
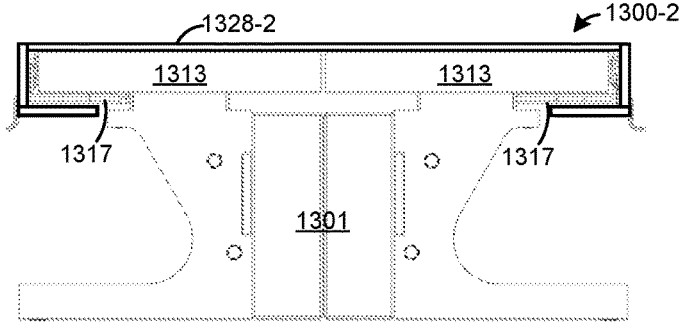

Attention next directed to FIG. 8B, which depicts a retention mechanism 1328-2 of the electromagnetic machine 1300-2 similar to the straps 128 and/or the retention mechanism 1328-1. As depicted, the retention mechanism 1328-2 perpendicularly extends between the cold plates 1317, and in particular from under the cold plates 1317, and around sides of the electromagnetic machine 1300-2, over the electrical windings 1313 and the pole portions 1309. Like the retention mechanism 1328-1, it is understood that the retention mechanism 1328-2 may be attached to the pole portions 1309, and/or any other suitable portion of the of the electromagnetic machine 1300-2 using any suitable fasteners, and/or other suitable mechanism.

Figure 8C:
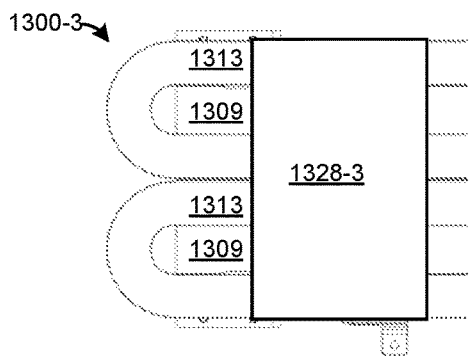
Figure 8C:
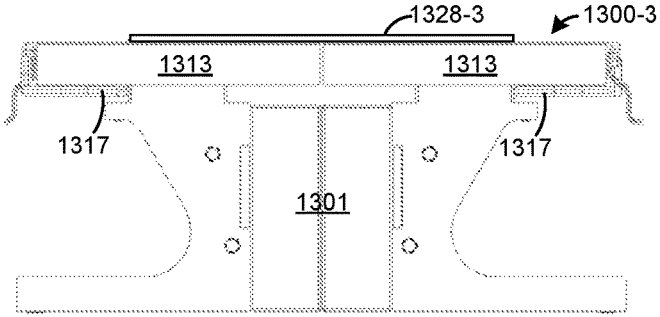

Attention next directed to FIG. 8C, which depicts a retention mechanism 1328-3 of the electromagnetic machine 1300-3, similar to the retention mechanism 1328-1, but extending from side-to-side across the electromagnetic machine 1300-3. As depicted, the retention mechanism 1328-2 perpendicularly extends across outer edges of the electrical windings 1313 and across the pole portions 1309. Like the retention mechanism 1328-1, it is understood that the retention mechanism 1328-3 may be attached to the pole portions 1309. Furthermore, while as depicted the retention mechanism 1328-3 is rectangular in shape, the retention mechanism 1328-3 may have any suitable shape.

Figure 8D:
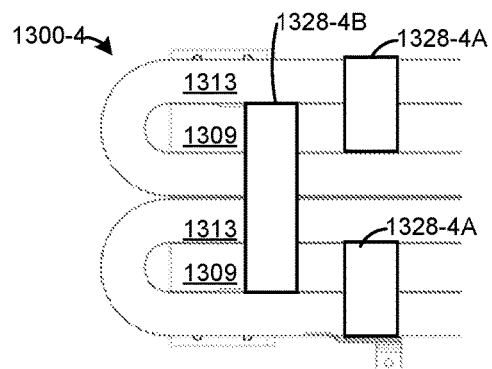
Figure 8D:
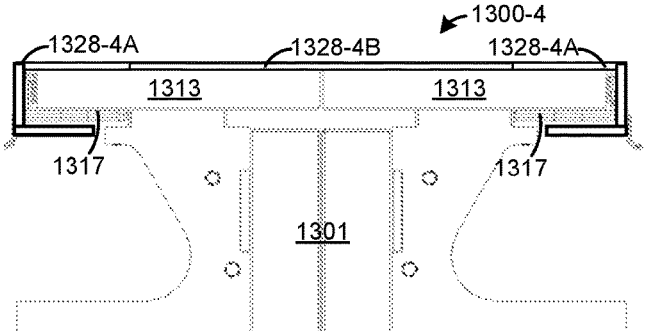

Attention next directed to FIG. 8D, which depicts retention mechanisms 1328-4A, 1328-4B of the electromagnetic machine 1300-4. At the depicted end of the electromagnetic machine 1300-4, there is one retention mechanism 1328-4A and two retention mechanisms 1328-4B, one at each opposing outer edge of respective electrical windings 1313. The retention mechanism 1328-4A is similar to the retention mechanism 1328-1, but is narrower in shape, and is understood to be attached to both pole portions 1309 and across the electrical windings 1313 between the pole portions 1309. As depicted, the retention mechanisms 1328-4B may be similar to the straps 128 and/or the retention mechanism 1328-2; however, a retention mechanism 1328-4B may perpendicularly extend from under one cold plate 1317, and around a respective side of the electromagnetic machine 1300-4 and, over respective electrical windings 1313 to a respective pole portion 1309. The retention mechanisms 1328-4A, 1328-4B may be attached to the pole portions 1309, and/or any other suitable portion of the of the electromagnetic machine 1300-4 using fasteners and/or any other suitable mechanism.

Furthermore, while some retention mechanisms 1328 are depicted as extending across outer edges of the electrical windings 1313 and/or extending fully across the pole portions 1309, the retention mechanisms 1328 may extend only partially across the electrical windings 1313 and/or only partially across the pole portions 1309, as long as the electrical windings 1313 are retained, and/or be of any suitable shape and/or configuration such that the electrical windings 1313 are retained.

FIG. 8A, FIG. 8B, FIG. 8C, and FIG. 8D hence generally illustrate that electrical windings of the electromagnetic machines provided herein may be retained using any suitable combination of retention mechanisms configured to retain electrical windings around pole portions thereof. Furthermore, such retention mechanisms may be removable in order to replace the electrical windings of the electromagnetic machines provided herein.

Retention mechanisms provided herein may be adapted in other ways. For example, attention is next directed to FIG. 9A and FIG. 9B which respectively depict top views of electromagnetic machines 1400-1, 1400-2 (e.g. electromagnetic machines 1400 and/or an electromagnetic machine 1400), with electrical windings, and other components removed, to show a respective segmented magnet 1401, respective pole portions 1409 and respective retention mechanisms 1428. The electromagnetic machines 1400 are understood to be similar to one or more of the electromagnetic machines 100, 1300. The magnets 1401, respective pole portions 1409 and retention mechanisms 1428 are understood to be respectively similar to the magnet 1301, respective pole portions 1309 and retention mechanism 1328-1, however, the electromagnetic machines 1400 may comprise any suitable retention mechanisms.

In particular, FIG. 9A and FIG. 9B further depict that the electromagnetic machines 1400 comprise three respective retention mechanisms 1428, one at each end of the pole portions 1409, and one at about the middle of the pole portions 1409, however the electromagnetic machines 1400 comprise any suitable number of respective retention mechanisms 1428.

In particular, as depicted, the retention mechanisms 1428 of the electromagnetic machine 1400-1 are understood to be electrically connected and/or bonded to the pole portions 1409 at a respective single "point" and/or region (e.g. which may be referred to as single-point grounding/bonding). For example, as depicted, the retention mechanisms 1428 of the electromagnetic machine 1400-1 are electrically connected and/or bonded to the pole portions 1409 at respective single points 1450 (e.g. which may comprise areas and/or regions rather than merely a point), for example using a fastener (e.g. a screw and/or bolt) that is electrically conducting. While any other suitable fasteners, such as screws, bolts, and the like, may be used to otherwise physically attach the retention mechanisms 1428 of the electromagnetic machine 1400-1 to the pole portions 1409, it is understood that such other fasteners do not electrically connect the retention mechanisms 1428 to the pole portions 1409. For example, fasteners at the single points 1450 may comprise electrically conducting material, whereas other fasteners, not at the single points 1450, may comprise non-electrically conducting material and/or electrically insulating material, and/or the other fasteners may be used in conjunction with non-electrically conducting and/or electrically insulating material washers, inserts, and the like. It is understood that any suitable combination of devices may be used to physically attach the retention mechanisms 1428 to the pole portions 1409, while also electrically isolating the retention mechanisms 1428 from the pole portions 1409 other than at the respective single points 1450. Furthermore, a pole portion facing aside of the retention mechanisms 1428 may comprise an electrically insulating layer to further electrically isolate the retention mechanisms 1428 from the pole portions 1409 (e.g. other than at the single points 1450)

Such an arrangement generally enables the retention mechanisms 1428 of the electromagnetic machine 1400-1, which may be electrically conducting, to be at a same and/or similar electrical potential as the pole portions 1409 and the other conducting components electrically connected to the pole portions 1409 (e.g. the magnet 1401), to dissipate charge and/or electrical coronas, while also reducing eddy currents between the retention mechanisms 1428 and the pole portions 1409. For example, as depicted, respective arrows 1451 that extend from the single points 1450, represent eddy currents that are contained at a retention mechanism 1428 and do not extend into the pole portions 1409.

In contrast, the retention mechanisms 1428 of the electromagnetic machine 1400-2 are understood to be to be electrically connected and/or bonded to the pole portions 1409 at a respective points 1460 and/or at a plurality of locations, for example at eight points per retention mechanism 1428. Such multiple points of electrical connection allow eddy currents, represented by arrows 1461, to flow between the retention mechanisms 1428 of the electromagnetic machine 1400-2 via the pole portions 1409. Hence, there may be a reduction in eddy currents in the electromagnetic machine 1400-1, as compared to the electromagnetic machine 1400-2, due to the single point bonding.

While not depicted, cold plates of electromagnetic machines provided herein may also be electrically connected to other electrically conducting portions of the electromagnetic machines using single point bonding. For example, retention mechanisms provided herein, such as the retention mechanisms 1328, 1428 may be electrically insulated from respective cold plates and such cold plates may be single point bonded to respective pole portions, or back-iron portions and the like. Alternatively, retention mechanisms provided herein, such as the retention mechanisms 1328, 1428 may be electrically insulated from respective pole portions and back-iron portions, and respective cold plates may be single point bonded to respective retention mechanisms. Indeed, any suitable combination of electrically conducting components of electromagnetic machines provided herein may be adapted for single point bonding and/or to reduce eddy currents.

In yet further examples, electromagnetic machines provided herein may be adapted to include magnetic flux sensors.

For example, attention is next directed to FIG. 10A, FIG. 10B and FIG. 10C which respectively depict different views of an electromagnetic machine 1500. In particular, FIG. 10A shows a top view, of an end of the electromagnetic machine 1500, with electrical connectors (e.g. similar to the connectors 123) removed, FIG. 10B shows and end view of an electromagnetic machine 1500, with retention plates (e.g. similar to the retention plates 129) removed, and FIG. 10C depicts a top view of the electromagnetic machine 1500 with electrical windings, and other components removed.

As depicted, the electromagnetic machine 1500 comprises a magnet 1501, back-iron portions 1508, pole portions 1509, and electrical windings 1513 around the respective pole portions 1509, which are respectively similar to the magnet 101, the back-iron portions 108, the pole portions 109, and the electrical windings 113 of the electromagnetic machine 100. However, as depicted, the magnets 1501 are segmented.

The electromagnetic machine 1500 may be substantially similar to any other of the electromagnetic machines described herein, however, the pole portions 1509 are adapted to include one or more magnetic flux sensors 1560, for example at opposite ends thereof and/or at about a middle thereof (e.g. as best seen in FIG. 10C); hence, for example, each pole portion 1509 includes three magnetic flux sensors 1560 such that there are six magnetic flux sensors 1560 in total. While not depicted, the pole portions 1509 may include grooves and/or apertures and/or recesses, and the like, at which the magnetic flux sensors 1560 may be received.

While examples of specific locations of the magnetic flux sensors 1560 are shown, it is understood that the magnetic flux sensors 1560 are positioned at any suitable location, and an electromagnetic machine 1500 may include any suitable number of magnetic flux sensors 1560. Regardless, a magnetic flux sensor 1560 is understood to measure magnetic flux flowing about perpendicular to a respective pole portion 1509.

As such, magnetic flux in the electromagnetic machine 1500 may be monitored, for example by an external computing device 1590 (e.g. at a vehicle and, the like, to which an electromagnetic machine 1500 is attached) which receives signals from the magnetic flux sensors 1560 that represent measured magnetic flux. Power to respective electrical windings of the electromagnetic machine 1500 (e.g. via respective connectors, similar to the connectors 123) may be controlled by the computing device in a feedback loop with signals from the magnetic flux sensors 1560 to control magnetic flux in the electromagnetic machine 1500 to given values. Hence, while not depicted, the magnetic flux sensors 1560 are understood to be adapted for communicative coupling to such a computing device, for example via any suitable harnessing and/or wiring and/or data connectors of the electromagnetic machine 1500 and/or via wireless communication links (e.g. in such examples, the magnetic flux sensors 1560 may include respective transceivers for wireless communication).

Hence, as depicted in FIG. 10C, the magnetic flux sensors 1560 are understood to be communicatively coupled with a computing device 1590 (e.g. wirelessly and/or via a data connector), the computing device 1590 controlling power to the electrical windings 1513 via a power sources 1599 connected to connectors (e.g. not depicted, but similar to the connectors 123) of the electrical windings 1513. Furthermore, while the magnetic flux sensors 1560 are depicted as being both deployed on an electromagnetic machine 1500, and as being separately communicatively coupled to a computing device 1590, it is understood that the electromagnetic machine 1500 (and a vehicle thereof) comprises wiring and/or harnessing and/or communication links connecting the magnetic flux sensors 1560 to a computing device 1590. Regardless, the computing device 1590 is understood to be configured to: control power to electrical windings 1513 of the electromagnetic machine 1500 based on magnetic flux measured by the magnetic flux sensors 1560.

Put another way, an electromagnetic machine provided herein may comprise one or more magnetic flux sensors configured to measure magnetic flux of one or more pole portions, and electrical windings of the electromagnetic machine may be controllable by a computing device communicatively coupled to the one or more magnetic flux sensors, the computing device configured to control the magnetic flux in a feedback loop with the one or more magnetic flux sensors.

Furthermore, the magnetic flux sensors 1560 may be removably attached to the pole portions 1509 such that the magnetic flux sensors 1560 may be replaced. It is yet further understood that, when wiring and/or harnessing connect the magnetic flux sensors 1560 to a computing device, such wiring and/or harnessing may be attached to back-iron portions and/or routed between electrical windings and pole portions and/or routed between an end of electrical windings into an aperture thereof (e.g. similar to the aperture 119) and/or between internal sides of electrical windings and adjacent external sides of pole portions. As such, as electrical windings provided herein are removable, such routing of wiring and/or harnessing may be provided in a manner such that the electrical windings are removable without affecting and/or removing the wiring and/or harnessing and/or the magnetic flux sensors.

For example, attention is next directed to FIG. 11A and FIG. 11B which depict: an end view and a top view of an electromagnetic machine 1600 (e.g. respectively similar to the views of the electromagnetic machine 1500 in FIG. 10B and FIG. 10C). The top view in FIG. 11B shows the electromagnetic machine 1600 with electrical windings, and other components removed. The electromagnetic machine 1600 is understood to include a segmented magnet 1601, back-iron portions 1608, pole portions 1609 and electrical windings 1613 (e.g. respectively similar to the segmented magnet 1501, back-iron portions 1508, pole portions 1509 and electrical windings 1513). FIG. 11B further schematically indicates relative positions of one pair of electrical connectors 1623 (e.g. similar to the connectors 123), which are removed from FIG. 11A. Similar to the electromagnetic machine 1500, the pole portions 1609 of the electromagnetic machine 1600 are adapted to include three magnetic flux sensors 1660 each (e.g. six magnetic flux sensors 1660 total). However, the electromagnetic machine 1600 may include any suitable number of one or more magnetic flux sensors 1660.

As also depicted in FIG. 11A and FIG. 11B, the electromagnetic machine 1600 includes a data connector 1670, adjacent the depicted pair of the connectors 1623, and wiring and/or harnessing 1675 between the data connector 1670 and the one or more magnetic flux sensors 1660. The electromagnetic machine 1600 is otherwise understood to be similar to the electromagnetic machine 1500 and/or other electromagnetic machines provided herein.

While the harnessing 1675 is depicted as being between the magnetic flux sensors 1660 and the data connector 1670 and located around sides of the electromagnetic machine 1600, the harnessing 1675 may be in any suitable position and/or path at the electromagnetic machine 1600 and may be attached to any suitable portion of the electromagnetic machine 1600 via any suitable combination of fasteners, clips, brackets, loops, belts and the like. For example, as best seen in FIG. 11A, the harnessing 1675 may be attached to the back-iron portions 1608 via fasteners 1690 (not depicted in FIG. 11B but nonetheless understood to be present). Furthermore, the harnessing 1675 is understood to be between the electrical windings 1613 and the pole portions 1609 (e.g. as indicated by dashed portions of the harnessing 1675 in FIG. 11A). Hence, in general, the harnessing 1675 is understood to be self-contained at electromagnetic machine 1600 (e.g. and is not attached to external structures such as a vehicle, and the like, to which electromagnetic machine 1600 may be attached. In particular, as mentioned above, such routing of the harnessing 1675 may be provided in a manner such that the electrical windings are removable without affecting and/or removing the wiring and/or harnessing and/or the magnetic flux sensors.

While, the data connector 1670 is depicted in a particular position, it is understood that the data connector 1670 may be in any suitable position and is understood to generally connect to a complementary data connector that connects the one or more magnetic flux sensors 1660 to a computing device (e.g. at a vehicle to which the electromagnetic machine 1600 is attached), for example to control power to the electromagnetic machine 1600 in a feedback loop with measured magnetic flux. The data connector 1670 and the harnessing 1675 may further convey power to the one or more magnetic flux sensors 1660 (e.g. which may require power to function).

Similarly, connectors of electromagnetic machines provided herein may be in any suitable positions.

For example, attention is next directed to FIG. 12A, FIG. 12B and FIG. 12C which respectively depict different views of electromagnetic machines 1700-1, 1700-2, 1700-3 (e.g. electromagnetic machines 1700 and/or an electromagnetic machine 1700) having different connector configurations. To better show details of the connector configurations, in each of FIG. 12A, FIG. 12B and FIG. 12C, a respective left hand side shows a top view of a respective electromagnetic machine 1700, electrical windings, cold plates, and other components removed (e.g. similar to the view of the electromagnetic machine 1500 in FIG. 10C), but showing positions/configurations of respective connectors and trays, and a respective right hand side shows a schematic end view of a respective electromagnetic machine 1700 (e.g. similar to the view of the electromagnetic machine 1500 in FIG. 10B) showing positions/configurations of respective connectors and trays.

As depicted, the electromagnetic machines 1700 include respective segmented magnets 1701 and two respective pole portions 1709.

With attention first directed to FIG. 12A, the electromagnetic machine 1700-1 is understood to comprise two pairs of connectors 1723-1, on opposite sides of the electromagnetic machine 1700-1, supported by respective trays 1724-1. While depicted schematically, the connectors 1723-1 and trays 1724-1 are understood to be substantially similar, respectively, to the connectors 123 and the trays 124. Similar to the electromagnetic machines 100, two pairs of connectors 1723-1 face in opposite directions, perpendicularly facing outward and away from the pole portions 1709, on opposite sides of the electromagnetic machine 1700-1, and at opposite ends of the electromagnetic machine 1700-1, with the trays 1724-1 adapted accordingly. Hence, the connectors 1723-1 of the electromagnetic machine 1700-1 have a similar configuration to the connectors 123 of the electromagnetic machine 100.

With attention next directed to FIG. 12B, the electromagnetic machine 1700-2 is understood to comprise two pairs of connectors 1723-2, supported by respective trays 1724-2, which are substantially similar, respectively, to the connectors 1723-1 and the trays 1724-1. However, in contrast to the electromagnetic machine 1700-1, the two pairs of connectors 1723-2 are located on a same side of the electromagnetic machine 1700-2, facing a same direction, perpendicularly facing outward and away from the pole portions 1709 at opposite ends of the electromagnetic machine 1700-2, with the trays 1724-2 adapted accordingly.

With attention next directed to FIG. 12C, the electromagnetic machine 1700-3 is understood to comprise two pairs of connectors 1723-3 located on a same side of the electromagnetic machine 1700-3, at opposite ends of the electromagnetic machine 1700-3, and supported by respective trays 1724-3. However, in contrast to the electromagnetic machines 1700-1, 1700-2, the two pairs of connectors 1723-3 are oriented "downward" and/or in a direction perpendicular to that of the connectors 1723-1, 1723-2, with the trays 1724-3 adapted accordingly.

Hence, FIG. 12A, FIG. 12B and FIG. 12C illustrate that connectors of electromagnetic machines provided herein may be in any suitable orientation and/or direction, for example for compatibility with an orientation and/or direction of respective complementary connectors at a vehicle, and the like, to which electromagnetic machines provided herein are attached.

In yet further examples, different physical configurations and/or assemblies of electromagnetic machines may be provided. For example, mounting devices (e.g. similar to the mounting devices 133) and/or retention plates (e.g. similar to the retention plates 129) of electromagnetic machines provided herein may have different physical configurations than the mounting devices 133 and/or the retention plates 129.

For example attention is next directed to FIG. 13A, FIG. 13B and FIG. 13C which respectively depict end views of respective electromagnetic machines 1800-1, 1800-2, 1800-3 (e.g. electromagnetic machines 1800 and/or an electromagnetic machine 1800) that show respective magnets 1801 and examples of different respective mounting devices 1833-1, 1833-2, 1833-3 (e.g. mounting devices 1833 and/or a mounting device 1833) that may be used in place of the mounting devices 133. In FIG. 13A, FIG. 13B and FIG. 13C it is understood that respective retention plates are removed to show respective magnets 1801 and that while only the magnets 1801 and the mounting devices 1833 are depicted, the electromagnetic machines 1800 may be similar to other electromagnetic machines provided herein, and include any suitable components (e.g. pole portions, back-iron portions, electrical windings etc.).

Furthermore, it is understood that each of the electromagnetic machines 1800 may comprise four respective mounting devices 1833, one on either side of a respective magnet 1801, and at opposite ends of the electromagnetic machines 1800. Hence, while FIG. 13A, FIG. 13B and FIG. 13C show end views of the electromagnetic machines 1800, and hence only two respective mounting devices 1833 are visible in FIG. 13A, FIG. 13B and FIG. 13C, it is understood that the electromagnetic machines 1800 may comprise two further respective mounting devices 1833 at an end opposite the depicted end (e.g. similar to the electromagnetic machine 100). However, electromagnetic machines provided herein may include any suitable number of mounting devices (e.g. less than, or greater than, four mounting devices) in any suitable positions.

With attention first directed to FIG. 13A, the mounting devices 1833-1 comprises two sections 1834-1, 1834-2, which are rectangular in shape, and perpendicularly joined together by respective fasteners 1835, for example, a screw, a bolt, and the like. As such, the mounting devices 1833-1 are "L" shaped. Alternatively, the two sections 1834-1, 1834-2 may be welded together and/or integral, and the like.

However, a mounting device 1833 may have any other suitable shape and/or may be provided in one section and/or piece. For example, attention is next directed to FIG. 13B, which shows the mounting devices 1833-2 provided as single respective pieces, which are rectangular in shape.

Similarly, attention is next directed to FIG. 13C, which shows the mounting devices 1833-3 provided as single respective pieces, which are have a shape similar to that of the ferromagnetic body 107.

Hence, FIG. 13A, FIG. 13B and FIG. 13C illustrate that mounting devices of electromagnetic machines provided herein may be in any suitable configuration and/or in any suitable number of sections (e.g. which may be joined together in any suitable manner) and/or be in any suitable shape. In particular, mounting devices of electromagnetic machines provided herein may have internal sides and/or pole-facing sides, and the like, that are of a shape and/or configuration that are suitable for removing and/or replacing electrical windings of the electromagnetic machines. For example, internal sides and/or pole-facing sides, and the like, of mounting devices of electromagnetic machines provided herein may be about parallel to external pole faces, for example which may form gaps and/or apertures of suitable shapes at which replaceable electrical windings may be removed and/or inserted.

For example attention is next directed to FIG. 14A, FIG. 14B and FIG. 14C which respectively depict end views of respective electromagnetic machines 1900-1, 1900-2, 1900-3 (e.g. electromagnetic machines 1900 and/or an electromagnetic machine 1900) that show respective magnets 1901, and examples of different respective retention plates 1929-1, 1929-2, 1929-3 (e.g. retention plates 1929 and/or a retention plate 1929) that may be used in place of the retention plates 129. In FIG. 14A, FIG. 14B and FIG. 14C it is understood that respective mounting devices 1933 are similar to the mounting devices 1833-3, but that any suitable mounting device may be used. It is further understood that while only the magnets 1901, the retention plates 1929 and the mounting devices 1933 are depicted, the electromagnetic machines 1900 may be similar to other electromagnetic machines provided herein, and include any suitable components (e.g. pole portions, back-iron portions, electrical windings etc.).

Furthermore, it is understood that each of the electromagnetic machines 1900 may comprise two respective retention plates 1929, one on either side of a respective magnet 1901, and at opposite ends of the electromagnetic machines 1900. Hence, while FIG. 14A, FIG. 14B and FIG. 14C show end views of the electromagnetic machines 1900, and hence only one respective retention plate 1929 is visible in FIG. 14A, FIG. 14B and FIG. 14C, it is understood that the electromagnetic machines 1900 may comprise a further respective retention plate 1929 at an end opposite the depicted end (e.g. similar to the electromagnetic machine 100).

With attention first directed to FIG. 14A, the retention plate 1929-1 comprises a band (and/or a narrow plate), and the like, which is rectangular in shape, and extends perpendicularly between the opposing mounting devices 1933. While not depicted, the retention plate 1929-1 may be joined to the mounting devices 1933 (e.g. by respective fasteners such as bolts, and the like, not depicted, and/or welding, and the like, etc.), and/or be integral with one or more of the mounting devices 1933.

However, a retention plate 1929 may have any other suitable shape and/or may be provided in one section and/or piece. For example, attention is next directed to FIG. 14B, which shows the retention plate 1929-2 provided as a plate, which is rectangular in shape, and which may be joined to the mounting devices 1933 (e.g. by respective fasteners such as bolts, and the like, not depicted, and/or welding, and the like, etc.), and/or be integral with one or more of the mounting devices 1933.

Furthermore, a retention plate may be provided in more than one section. For example, attention is next directed to FIG. 14C, which shows the retention plate 1929-3 provided in two sections 1934-1, 1934-2, each of the sections 1934-1, 1934-2 comprising respective bands, and the like, which are rectangular in shape, and extend perpendicularly between the opposing mounting devices 1933. While not depicted, one or more of the sections 1934-1, 1934-2 of the retention plate 1929-3 may be joined to the mounting devices 1933 (e.g. by respective fasteners such as bolts, and the like, not depicted, and/or welding, and the like, etc.), and/or be integral with one or more of the mounting devices 1933.

Hence, FIG. 14A, FIG. 14B and FIG. 14C illustrate that retention plates of electromagnetic machines provided herein may be in any suitable configuration and/or in any suitable number of sections and/or be in any suitable shape.

Furthermore, such retention plates may be shaped to facilitate replacement of electrical windings of electromagnetic machines provided herein.

It is hence further understood that any features of any of the electromagnetic machines provided herein may be combined in any suitable manner with features of other electromagnetic machines provided herein.

In this specification, components may be described as "configured to" perform one or more functions or "configured for" such functions. In general, a component that is configured to perform or configured for performing a function is enabled to perform the function, or is suitable for performing the function, or is adapted to perform the function, or is operable to perform the function, or is otherwise capable of performing the function.

It is understood that for the purpose of this specification, language of "at least one of X, Y, and Z" and "one or more of X, Y and Z" can be construed as X only, Y only, Z only, or any combination of two or more items X, Y, and Z (e.g., XYZ, XY, YZ, XZ, and the like). Similar logic can be applied for two or more items in any occurrence of "at least one . . . " and "one or more . . . " language.

The terms "about", "substantially", "essentially", "approximately", and the like, are defined as being "close to", for example as understood by persons of skill in the art. In some examples, the terms are understood to be "within 10%," in other examples, "within 5%", in yet further examples, "within 1%", and in yet further examples "within 0.5%".

Persons skilled in the art will appreciate that in some examples, the functionality of computing devices (e.g. computing device 1590) and/or methods and/or processes described herein can be implemented using pre-programmed hardware or firmware elements (e.g., an application specific integrated circuit (ASIC), a Field Programmable Gate Array (FPGA), a programmable array logic (PAL), a programmable logic array (PLA), a programmable logic device (PLD), electrically erasable programmable read-only memories (EEPROMs), etc.), or other related components. In other examples, the functionality of the computing devices and/or methods and/or processes described herein can be achieved using a computing apparatus that has access to a code memory (not shown) which stores computer-readable program code for operation of the computing apparatus. The computer-readable program code could be stored on a computer readable storage medium which is fixed, tangible and readable directly by these components, (e.g., removable diskette, CD-ROM (Compact Disc-Read-Only Memory), ROM (Read-Only Memory), fixed disk, USB (Universal Serial Port) drive, optical drive, and the like). Furthermore, it is appreciated that the computer-readable program can be stored as a computer program product comprising a computer usable medium. Further, a persistent storage device can comprise the computer readable program code. It is yet further appreciated that the computer-readable program code and/or computer usable medium can comprise a non-transitory computer-readable program code and/or non-transitory computer usable medium. Alternatively, the computer-readable program code could be stored remotely but transmittable to these components via a modem or other interface device connected to a network (including, without limitation, the Internet) over a transmission medium. The transmission medium can be either a non-mobile medium (e.g., optical and/or digital and/or analog communications lines) or a mobile medium (e.g., microwave, infrared, free-space optical or other transmission schemes) or a combination thereof. Furthermore, such computing devices (e.g. computing device 1590) and/or methods and/or processes described herein may be implemented using "engines" which may be understood to include hardware (e.g. implemented as an ASIC, an FPGA, a PAL, a PLA, a PLD etc.), and/or a combination of hardware and software (e.g. a combination of hardware and software includes software hosted at hardware, such as a software module that is stored at a processor-readable memory implemented or interpreted by a processor), or hardware and software hosted at hardware.

Persons skilled in the art will appreciate that there are yet more alternative examples and modifications possible, and that the above examples are only illustrations of one or more examples. The scope, therefore, is only to be limited by the claims appended hereto.

What is claimed is:

1. An electromagnetic machine for generating force comprising:
   a magnet having opposing sides extending along a longitudinal axis;
   a pair of ferromagnetic bodies respectively extending along the opposing sides of the magnet, and along the longitudinal axis, each of the ferromagnetic bodies comprising: a back-iron portion; and a pole portion extending from the back-iron portion;
   the magnet and the ferromagnetic bodies comprising reciprocal retention devices at the opposing sides along the longitudinal axis;
   electrical windings around respective pole portions of the ferromagnetic bodies, the electrical windings around the respective pole portions being independently controllable; and
   at least one cold plate configured to thermally isolate the magnet from the electrical windings.

2. The electromagnetic machine of claim 1, wherein the magnet is segmented.

3. The electromagnetic machine of claim 1, wherein the reciprocal retention devices comprise respective rib-and-slot structures at the opposing sides along the longitudinal axis, ribs and slots, of the respective rib-and-slot structures, being complementary to each other.

4. The electromagnetic machine of claim 3, wherein the ribs are keyed into respective complementary slots.

5. The electromagnetic machine of claim 3, wherein the ribs are located along the opposing sides of the magnet, and the slots are located along back-iron portions of the ferromagnetic bodies.

6. The electromagnetic machine of claim 3, wherein the ribs are located along the opposing sides of the magnet, the ribs comprising ferromagnetic material attached to the magnet, and the slots are located along back-iron portions of the ferromagnetic bodies.

7. The electromagnetic machine of claim 3, wherein the slots are located along the opposing sides of the magnet, and the ribs are located along back-iron portions of the ferromagnetic bodies.

8. The electromagnetic machine of claim 1, further comprising retention plates located at opposite ends of the longitudinal axis, the retention plates configured to hold the magnet between the ferromagnetic bodies.

9. The electromagnetic machine of claim 8, wherein the retention plates are attached to back-iron portions of the ferromagnetic bodies at the opposite ends.

10. The electromagnetic machine of claim 8, further comprising a frame, and wherein the retention plates are attached to the frame at the opposite ends.

11. The electromagnetic machine of claim 1, wherein the at least one cold plate is located between the electrical windings and the magnet.

12. The electromagnetic machine of claim 1, wherein the at least one cold plate is located between the electrical windings and: both the magnet and back-iron portions of the ferromagnetic bodies.

13. The electromagnetic machine of claim 1, wherein the at least one cold plate resides on respective ledges of back-iron portions of the ferromagnetic bodies.

14. The electromagnetic machine of claim 1, wherein the at least one cold plate comprises:
one or more cooling channels; and
connectors to connect the one or more cooling channels to a liquid coolant supply.

15. The electromagnetic machine of claim 1, wherein the at least one cold plate is one or more of a "W" shape, an "M" shape and an "E" shape.

16. The electromagnetic machine of claim 1, further comprising respective electrical connectors to the electrical windings.

17. The electromagnetic machine of claim 1, wherein back-iron portions of the ferromagnetic bodies are chamfered at respective opposite sides of the magnet.

18. The electromagnetic machine of claim 1, wherein a ferromagnetic body, of the ferromagnetic bodies, is one or more of solid and/or formed from a single piece of ferromagnetic material.

19. The electromagnetic machine of claim 1, further comprising one or more magnetic flux sensors configured to measure magnetic flux of the respective pole portions, wherein the electrical windings are controllable by a computing device communicatively coupled to the one or more magnetic flux sensors, and the computing device is configured to control the magnetic flux in a feedback loop with the one or more magnetic flux sensors.

* * * * *